US009252802B2

(12) United States Patent
Hollis

(10) Patent No.: US 9,252,802 B2
(45) Date of Patent: Feb. 2, 2016

(54) ENCODING FOR PARTITIONED DATA BUS

(71) Applicant: QUALCOMM Incorporated, San Diego, CA (US)

(72) Inventor: Timothy Mowry Hollis, Poway, CA (US)

(73) Assignee: QUALCOMM Incorporated, San Diego, CA (US)

(*) Notice: Subject to any disclaimer, the term of this patent is extended or adjusted under 35 U.S.C. 154(b) by 78 days.

(21) Appl. No.: 14/175,394

(22) Filed: Feb. 7, 2014

(65) Prior Publication Data
US 2015/0229325 A1    Aug. 13, 2015

(51) Int. Cl.
*H03M 13/11* (2006.01)
*H03M 5/20* (2006.01)
*G06F 13/42* (2006.01)
*H03M 5/16* (2006.01)
*H04L 12/40* (2006.01)
*H04L 25/49* (2006.01)

(52) U.S. Cl.
CPC .............. *H03M 5/20* (2013.01); *G06F 13/4221* (2013.01); *H03M 5/16* (2013.01); *H04L 12/40182* (2013.01); *H04L 25/4917* (2013.01)

(58) Field of Classification Search
CPC ...................................................... H04L 1/0057
USPC .......... 714/752, 798, 701, 775, 758, 767, 735
See application file for complete search history.

(56) References Cited

U.S. PATENT DOCUMENTS

| 5,182,752 | A | * | 1/1993 | DeRoo et al. | 714/758 |
| 5,373,512 | A | * | 12/1994 | Brady | 714/767 |
| 5,384,767 | A | * | 1/1995 | Moorwood et al. | 370/408 |
| 5,481,727 | A | * | 1/1996 | Asano et al. | 711/150 |
| 5,544,179 | A | * | 8/1996 | Hartwell | 714/798 |
| 8,094,045 | B2 | | 1/2012 | Hollis | |
| 8,260,992 | B2 | | 9/2012 | Dearth et al. | |
| 8,510,490 | B2 | | 8/2013 | Abbasfar | |
| 2011/0222623 | A1 | | 9/2011 | Hollis | |

OTHER PUBLICATIONS

Hollis T.M., et al., "Data Bus Inversion in High-Speed Memory Applications," IEEE Transactions on Circuits and Systems—II: Express Briefs, Apr. 2009, vol. 56 (4), pp. 300-304.
International Search Report—PCT/US2015/014730—ISA/EPO—May 28, 2015.

(Continued)

*Primary Examiner* — Fritz Alphonse
(74) *Attorney, Agent, or Firm* — Loza & Loza, LLP

(57) ABSTRACT

A data bus is split into partitions and encoding is independently applied to data transmitted over each bus partition to improve power and/or throughput efficiency. The encoding can be data bus inversion or any other suitable type of encoding. An encoding indicator symbol transmitted in conjunction with the data indicates which bus partition is encoded, if any. In some implementations, encoding is selectively applied to each bus partition during each data transfer cycle of a parallel data bus. In some implementation, the encoding indicator symbol is a multi-level signal where each level of the multi-level signal represents at least two bits of information indicative of, for a corresponding bus partition, whether encoding is applied to the data to be transmitted over the bus partition. Advantageously, the encoding indicator symbol can be transmitted over a single, dedicated bus line.

27 Claims, 21 Drawing Sheets

(56) References Cited

OTHER PUBLICATIONS

Kamal M., et al., "GPH: A Group-Based Partitioning Scheme for Reducing Total Power Consumption of Parallel Buses", Microprocessors and Microsystems, vol. 35, No. 1, Feb. 2011, XP028133256, pp. 68-80, DOI:10.1016/J.MICPR0.2010.09.005 [retrieved on Sep. 23, 2010].

Rokhani F Z., et al., "Low-Power Bus Transform Coding for Multi-level Signals", Asia Pacific Conference on Circuits and Systems, IEEE, Dec. 2006, XP031071074, pp. 1272-1275, ISBN:978-1-4244-0387-5.

Sun J., et al., "Partitioned Bus-Invert Coding for Power Consumption Optimization of Data Bus", International Conference on Computer Research and Development, 2011, IEEE, Mar. 11, 2011, XP031864278, pp. 452-455, DOI:10.1109/ICCRD.2011.5764172, ISBN:978-1-61284-839-6.

* cited by examiner

ENCODING FOR PARTITIONED DATA BUS

TECHNICAL FIELD

Aspects of the present disclosure relate generally to data encoding and more particularly, but not exclusively, to encoding for a partitioned data bus.

BACKGROUND

Data transmission across interconnects may take a number of forms. One example of a configuration for facilitating data transmission between components is use of a data bus, where a transmitting component sends data signals, also called data bits, to a receiving component over a group of parallel transmission channels. The data bits are typically subject to inter-symbol interference (ISI), crosstalk, and simultaneous switching noise (SSN) that can alter the amplitude and timing of the data bits. Often, the data bits may be encoded to reduce the effects of ISI, crosstalk, or SSN using various techniques of data encoding. One specific form of data encoding is data bus inversion (DBI).

SUMMARY

The following summarizes some aspects of the present disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a summary form as a prelude to the more detailed description that is presented later.

Various aspects of the present disclosure provide for splitting a data bus into partitions and independently applying encoding to data transmitted over each bus partition to reduce power consumption and/or improve encoding efficiency. The encoding can be data bus inversion or any other suitable type of encoding. In some implementations, encoding is selectively applied to each bus partition during each data transfer cycle for a parallel data bus. An encoding indicator symbol transmitted in conjunction with the data indicates which bus partition is encoded, if any.

In some implementations, the encoding indicator symbol is a multi-level signal (also referred to herein as a multi-state signal) where each level (state) of the multi-level signal represents at least two bits of information indicative of, for a corresponding bus partition, whether encoding is applied to the data to be transmitted over the bus partition. Advantageously, the encoding indicator symbol can be transmitted over a single, dedicated bus line. For example, a multi-level encoding indicator symbol conveyed over a bit line intended for an encoding flag (such as a DBI flag), can provide both bus segmentation information and an encoding indicator for each bus segment over the single bit line. By transmitting the encoding indictor symbol as a multi-level signal, multiple indications (i.e., one for each bus partition) can be transmitted during each bus cycle. As such, the bus may be partitioned into smaller subsets for improved efficiency, and all corresponding encoding indications may be transmitted simultaneously using only a single pin.

Further aspects of the disclosure provide an apparatus configured for communication that includes a processing circuit and a bus interface coupled to the processing circuit. The processing circuit is configured to generate an encoding indicator symbol that indicates partitioning of a data bus and encoding applied to different partitions of the data bus. The bus interface is configured to transmit the encoding indicator symbol.

Still further aspects of the disclosure provide a method for generating an encoding indicator symbol that indicates partitioning of a data bus and encoding applied to different partitions of the data bus; and transmitting the encoding indicator symbol.

Additional aspects of the disclosure provide an apparatus configured for communication. The apparatus including means for generating an encoding indicator symbol that indicates partitioning of a data bus and encoding applied to different partitions of the data bus; and means for transmitting the encoding indicator symbol.

Other aspects of the disclosure provide a non-transitory machine-readable storage medium, having instructions stored thereon which when executed by at least one processor causes the at least one processor to: generate an encoding indicator symbol that indicates partitioning of a data bus and encoding applied to different partitions of the data bus; and transmit the encoding indicator symbol.

Further aspects of the disclosure provide an apparatus configured for communication that includes a processing circuit and a bus interface coupled to the processing circuit. The bus interface is configured to receive data via a data bus and an encoding indicator symbol that indicates partitioning of the data bus and encoding applied to different partitions of the data bus. The processing circuit is configured to decode the received data based on the encoding indicator symbol.

Still further aspects of the disclosure provide a method for receiving data via a data bus; receiving an encoding indicator symbol that indicates partitioning of the data bus and encoding applied to different partitions of the data bus; and decoding the received data based on the encoding indicator symbol.

Additional aspects of the disclosure provide an apparatus configured for communication. The apparatus including means for receiving data via a data bus; means for receiving an encoding indicator symbol that indicates partitioning of the data bus and encoding applied to different partitions of the data bus; and means for decoding the received data based on the encoding indicator symbol.

Other aspects of the disclosure provide a non-transitory machine-readable storage medium, having instructions stored thereon which when executed by at least one processor causes the at least one processor to: receive data via a data bus; receive an encoding indicator symbol that indicates partitioning of the data bus and encoding applied to different partitions of the data bus; and decode the received data based on the encoding indicator symbol.

Examples of other aspects of the disclosure related to the above follow. The encoding indicator symbol may be a multi-level signal, whereby each level of the multi-level signal represents at least two bits of information indicative of, for each partition of the data bus, whether encoding is applied to the partition. Such a multi-level signal can be defined as multiple voltage levels, multiple current levels, multiple phases, other types of levels, or a combination of these levels. In some implementations, the data bus is a parallel bus and the transmission/reception of the encoding indicator symbol comprises transmitting/receiving the encoding indicator symbol over a dedicated bus line. A parallel set of data bits may be transmitted/received over the data bus during a bus cycle, wherein the transmission/reception of the encoding indicator symbol comprises transmitting/receiving the encoding indicator symbol via a single signal pin during the bus cycle. Also, for each partition of the data bus, a determination may be made as to whether to encode a subset of data to be sent over the partition, wherein the generation of the encoding indicator symbol comprises selecting a value that indicates any partitions for which the corresponding subset of data is encoded. In some cases, the determination of whether to encode a subset of data comprises: determining whether encoding of the subset of data would reduce power consumption associated with transmission of the subset of data or reduce interference associated with transmission of the subset of data. Furthermore, a selection can be made to identify a partitioning of the data bus that results in lowest power consumption associated with transmission of data over the partitions or lowest interference associated with transmission of data over the partitions. Similarly, a selection can be made to identify a type of encoding to be applied to the different partitions that results in lowest power consumption associated with transmission of data over the partitions or lowest interference associated with transmission of data over the partitions. Also, for each partition of the data bus, a determination may be made, based on the encoding indicator symbol, as to whether a subset of data received via the partition is encoded. In this case, the subset of data is decoded if the encoding indicator symbol indicates that the subset of data is encoded.

These and other aspects of the invention will become more fully understood upon a review of the detailed description, which follows. Other aspects, features, and implementations of the present invention will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
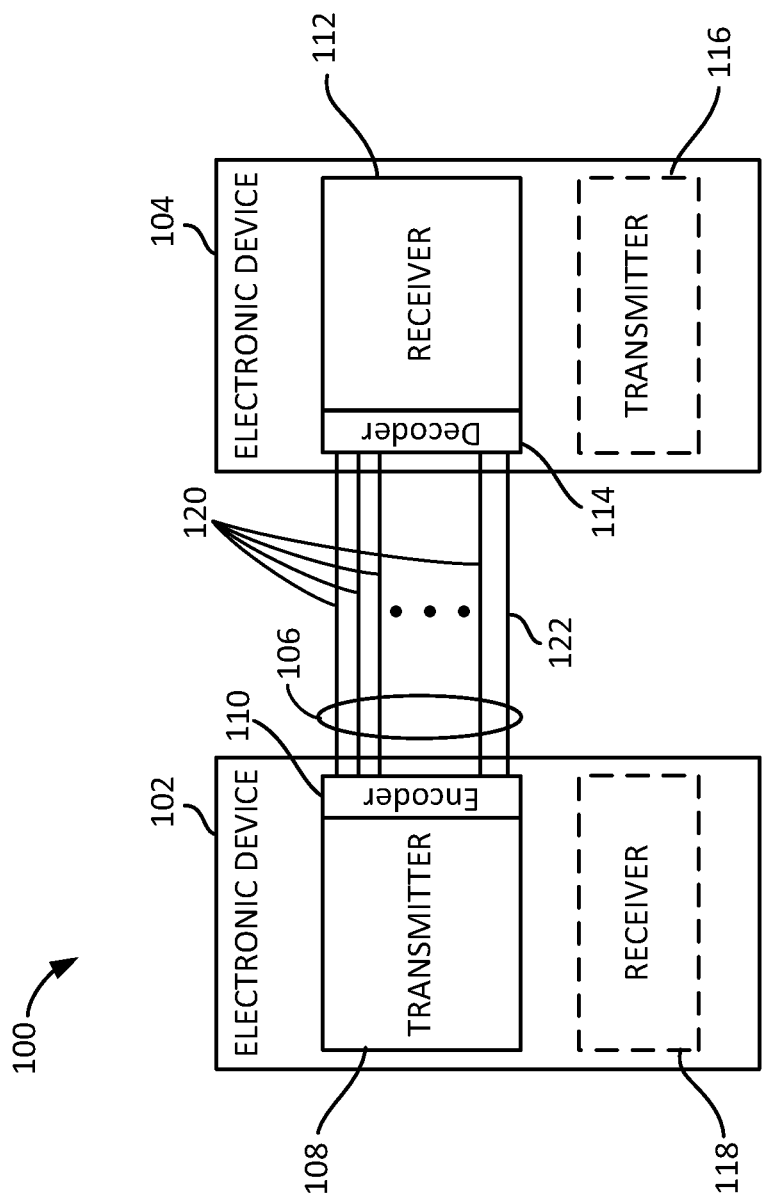
FIG. 1 is a simplified block diagram of an example of a system environment in which one or more aspects of the present disclosure may find application.

FIG. 1 is a block diagram illustrating an example of a system 100 in which one or more aspects of the present disclosure may find application. The system 100 includes a first electronic device 102 and a second electronic device 104 communicatively coupled to each other by a parallel data bus 106. The first electronic device 102 is shown with emphasis on transmitting aspects and includes a transmitter 108 with an encoder 110 and adapted to send encoded data bits from the first electronic device 102 to the second electronic device 104 over the data bus 106. The second electronic device 104 is shown with emphasis on receiving aspects and includes a receiver 112 with a decoder 114 for receiving and decoding the encoded data bits. In some examples, the data bus 106 may be a unidirectional bus. In other examples, the data bus 106 may be a bidirectional bus, in which case the second electronic device 104 may include a transmitter 116 adapted to send data bits over the data bus 106 to a receiver 118 of the first electronic device 102. The coupling of the data bus 106 to the transmitter 116 and the receiver 118 is not shown to reduce the complexity of FIG. 1.

The first and second electronic devices 102 and 104 may be any devices that can communicate using communication signaling (e.g., single-ended signaling). In various examples, the first and second electronic devices 102 and 104 may be components in a computer system. For example, in some implementations, the first electronic device 102 may be a processing unit, the second electronic device 104 may be a memory module, and the data bus 106 may be a system bus. In at least one example, a memory controller interface (e.g., a physical memory interface circuit PHY) of the processor and a memory module may include respective transmitters and receivers to perform write and read operations. The processor may be any suitable type of processing unit, such as a central processing unit (CPU), a co-processor, an arithmetic processing unit, a graphics processing unit (GPU), a digital signal processor (DSP), etc. The memory module may also be any suitable type of memory. In some implementations, the second electronic device 104 may be another type of device, such as a bridge controller, a storage device (e.g., hard drive, optical drive, flash drive, storage array, etc.), a network interface device (e.g., to a local or wide-area network), a user interface device (e.g., display device, sound device, printer), etc. In some examples, the first and second electronic devices 102 and 104 may be separate cores within a processing unit or separate processing units in a system. Accordingly, in at least one example, the system 100 may be a communication network, where the first and second electronic devices 102 and 104 may be routers, switches, end devices, etc. Thus, in general, the first and second electronic devices 102 and 104 may be any suitable devices adapted to send and/or receive data bits over a data bus 106.

As used herein, the terms data, data bits and so forth refer generally to information that can be carried over a communication medium. Thus, data can include and a data bus can carry, for example, control information, address information, signaling information, timing information, user data, payload, and so on.

The data bus 106 may include approximately parallel conductive traces or lines that may be referred to as channels 120, and these channels 120 can be coupled at each end to respective pins in the electronic devices 102 and 104. The number of channels 120 of the data bus 106 may vary according to different implementations. By way of example only, the data bus 106 may include 4, 8, 16, 32, 64, 72, or some other number of data channels 120. At least one additional channel 122 may be provided to transmit control signals in parallel with the data bits. For example, a data bus 106 may have 72 data channels and 8 control channels 122 for a total of 80 channels. As discussed in more detail below, one of the control channels 122 may be used for sending an indication of the encoding used on the data bus 106 (e.g., encoding used on the data bits transmitted over the data channels 120). The bus may additionally support an accompanying clocking topology (not shown).

The data bits transmitted over the channels 120 are binary data bits including "ones" (1s) and "zeros" (0s), or high and low voltages. As the data bits are transmitted over the data bus 106, the data bits are typically subject to inter-symbol interference (ISI), crosstalk, and simultaneous switching noise (SSN) that can alter the amplitude and timing of the data bits. Often, the data bits may be encoded to reduce the effects of ISI, crosstalk, and/or SSN using various techniques of data encoding. Data encoding also can be employed to reduce power consumption associated with the transmission of data bits.

Data bus inversion (DBI) is a known technique for reducing power consumption in communication interfaces. The effectiveness of the encoding may be dependent on the width of the parallel data (bus) being encoded. Thus, partitioning the bus into smaller subsets is one way to potentially improve the efficiency of a communication system and further reduce power. However, in some implementations, the additional pin(s) needed to communicate the DBI flags for the different subsets to the receiver is too costly. Consequently DBI partitioning is not used in many implementations where it could otherwise prove beneficial.

Figure 2:
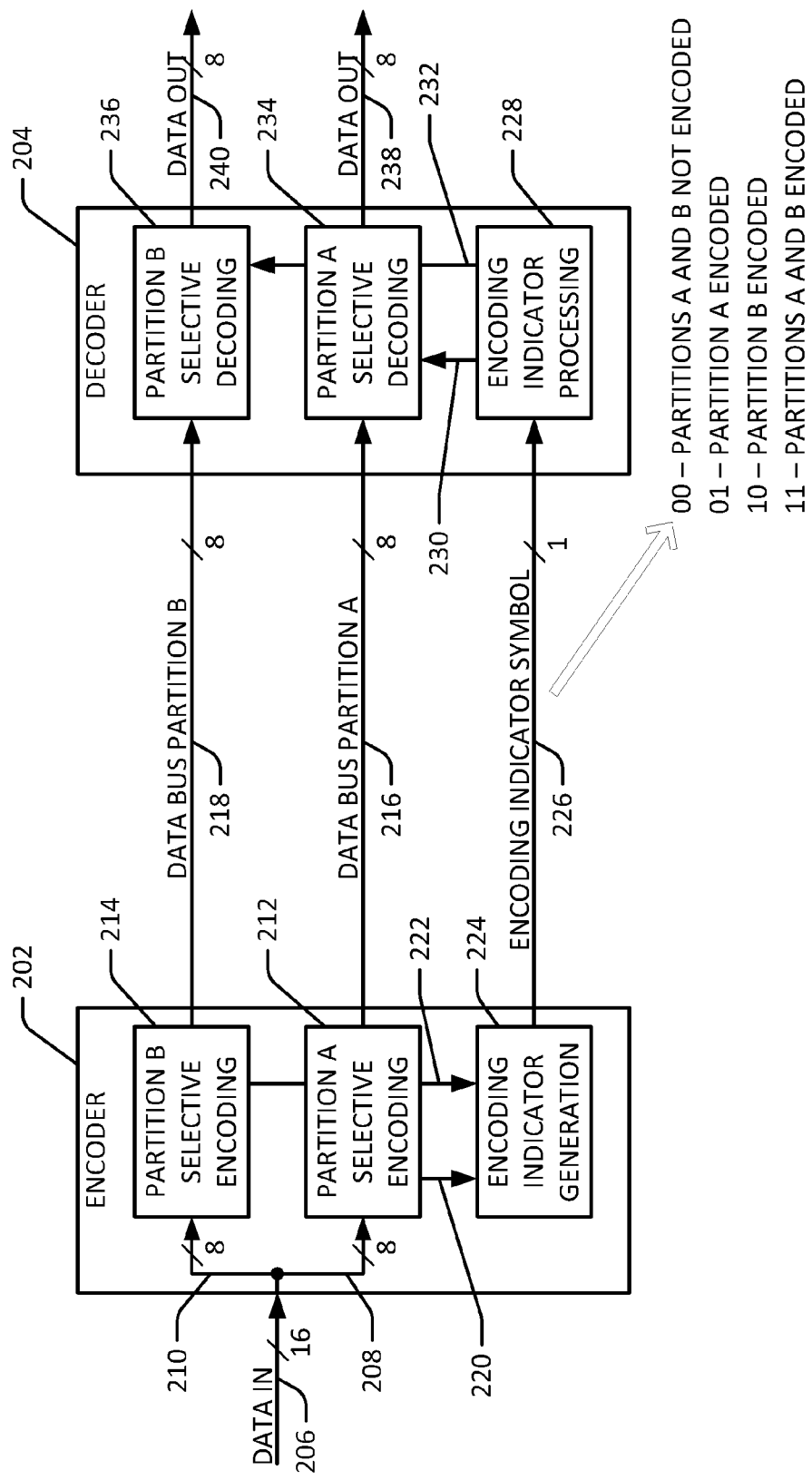
FIG. 2 is a simplified block diagram illustrating selective decoding for bus partitions according to at least one example of the present disclosure.

FIG. 2 is a block diagram illustrating an example of selective encoding for bus partitions that employs an encoding indicator symbol in accordance with the teachings herein. Advantageously, the encoding indicator symbol identifies any bus partitions that are encoded, and can be transmitted over a single signaling line (e.g., a bus bit line). For example, as discussed in more detail below, the encoding indicator symbol may comprise a multi-level signal (multi-state signal) where each "level" ("state") represents two or more bits indicating a bus partitioning and/or encoding. Also, in some implementations, each "level" ("state") may represent the type of encoding to be applied to a corresponding bus partition.

In FIG. 2, an encoder 202 selectively encodes data that is sent to a decoder 204. In particular, the encoder 202 partitions an input data bus (DATA IN) 206 into different partitions and independently encodes each partition. In the example of FIG. 2, a 16 bit (i.e., 16 line) data bus 206 is split into two 8 bit partitions. Other partitioning formats may be employed in other implementations. For example, a bus may be split into a larger number of partitions, the number of bits in each partition may be different from the number shown in the figures herein, and the number of bits in different partitions may differ.

As shown, the input data bus 206 is divided into a first partition 208 (partition A) and a second partition 210 (partition B). Partition A selective encoding 212 determines, e.g., on a bus cycle basis, whether to encode the data on the first partition 208. Independent of the operation of the partition A selective encoding 212, partition B selective encoding 214 determines, e.g., on a bus cycle basis, whether to encode the data on the second partition 210.

The decision as to whether encoding is applied to a given partition is made based on one or more factors (e.g., communication performance factors). For example, in some cases, encoding is applied to a subset of data to be transmitted over a given bus partition if doing so will reduce the power consumption associated with data transmission. Conversely, if no power savings or insignificant power savings would be achieved by encoding, the subset of data is instead transmitted without encoding. As another example, in some cases, encoding is applied to a subset of data to be transmitted over a given bus partition if doing so will reduce interference associated with data transmission. Conversely, if no interference reduction or insignificant interference reduction would be achieved by encoding, the subset of data is instead transmitted without encoding.

After the encoding or no encoding decision is made, the encoder 202 transmits the data via a partitioned data bus to the decoder 204. Specifically, the encoder 202 transmits a first subset of the data, that may have been encoded by the partition A selective encoding 212, via a data bus partition A 216. Similarly, the encoder 202 transmits a second subset of the data, that may have been encoded by the partition B selective encoding 214, via a data bus partition B 218.

It should be appreciated that terms such as "bus partitions" and "partitioned bus" used herein do not require that the bus be physically partitioned. Rather, the partitioning may simply relate to treating the data to be sent over different sets of bit lines of the bus in a different way. For example, a decision to encode a subset of data to be transmitted over one partition may be made independently of a decision to encode another subset of data to be transmitted over another partition. As another example, different encoding may be applied to the different subsets of data for different bus partitions.

The encoder 202 sends encoding information to the decoder 204 so that the decoder 204 can determine whether a given partition has been encoded by the encoder 202. To this end, the partition A selective encoding 212 and the partition B selective encoding 214 send an indication 220 and an indication 222, respectively, of the corresponding encoding or no encoding decision to an encoding indicator generator 224. Based on these indications, the encoding indicator generator 224 generates an encoding indicator symbol that is then transmitted to the decoder 204 via a bit line 226.

In the example of FIG. 2, the encoding indicator symbol represents two bits of information indicative of the bus partitioning and whether encoding has been applied to a given bus partition. Specifically, a two bit value of 00 indicates that neither partition A data nor partition B data has been encoded. A two bit value of 01 indicates that only partition A data has been encoded. A two bit value of 10 indicates that only partition B data has been encoded. A two bit value of 11 indicates that both partition A data and partition B data have been encoded. It should be appreciated that an encoding indicator symbol could represent a different number of bits (e.g., three or more) in other implementations.

Encoding indicator processing 228 of the decoder 204 receives the encoding indicator symbol and generates indications 230 and 232 indicative of whether encoding is active on the data bus partitions A and B 216 and 218. The indication 230 indicates whether the data on the data bus partition A 216 is encoded. The indication 232 indicates whether the data on the data bus partition B 218 is encoded. As indicated, the encoding indicator processing 228 sends the indication 230 to the partition A selective decoding 234 and the indication 232 to the partition B selective decoding 236.

Consequently, the decoder 204 can determine, independently for each bus partition, whether decoding needs to be invoked for that bus partition. The partition A selective decoding 234 determines, based on the indication 230, whether to decode the data received on the data bus partition A 216. Independent of the operation of the partition A selective decoding 234, the partition B selective decoding 236 determines, based on the indication 232, whether to decode the data received on the data bus partition B 218.

As discussed herein, these encoding decisions are made on a bus cycle basis in some implementations. For example, the encoder 202 can send a new encoding indicator symbol in parallel with every data transfer cycle on the partitioned data bus. Thus, the decoder 204 can determine, for every data transfer, whether decoding is to be applied to the data received on any of the bus partitions.

With the above in mind, examples of operations relating to encoding and decoding according to the present disclosure will now be described in more detail in conjunction with the flowcharts of FIGS. 3 and 4. For convenience, the operations of FIGS. 3 and 4 (or any other operations discussed or taught herein) may be described as being performed by specific components. It should be appreciated, however, that in various implementations these operations may be performed by other types of components and may be performed using a different number of components. It also should be appreciated that one or more of the operations described herein may not be employed in a given implementation.

Figure 3:
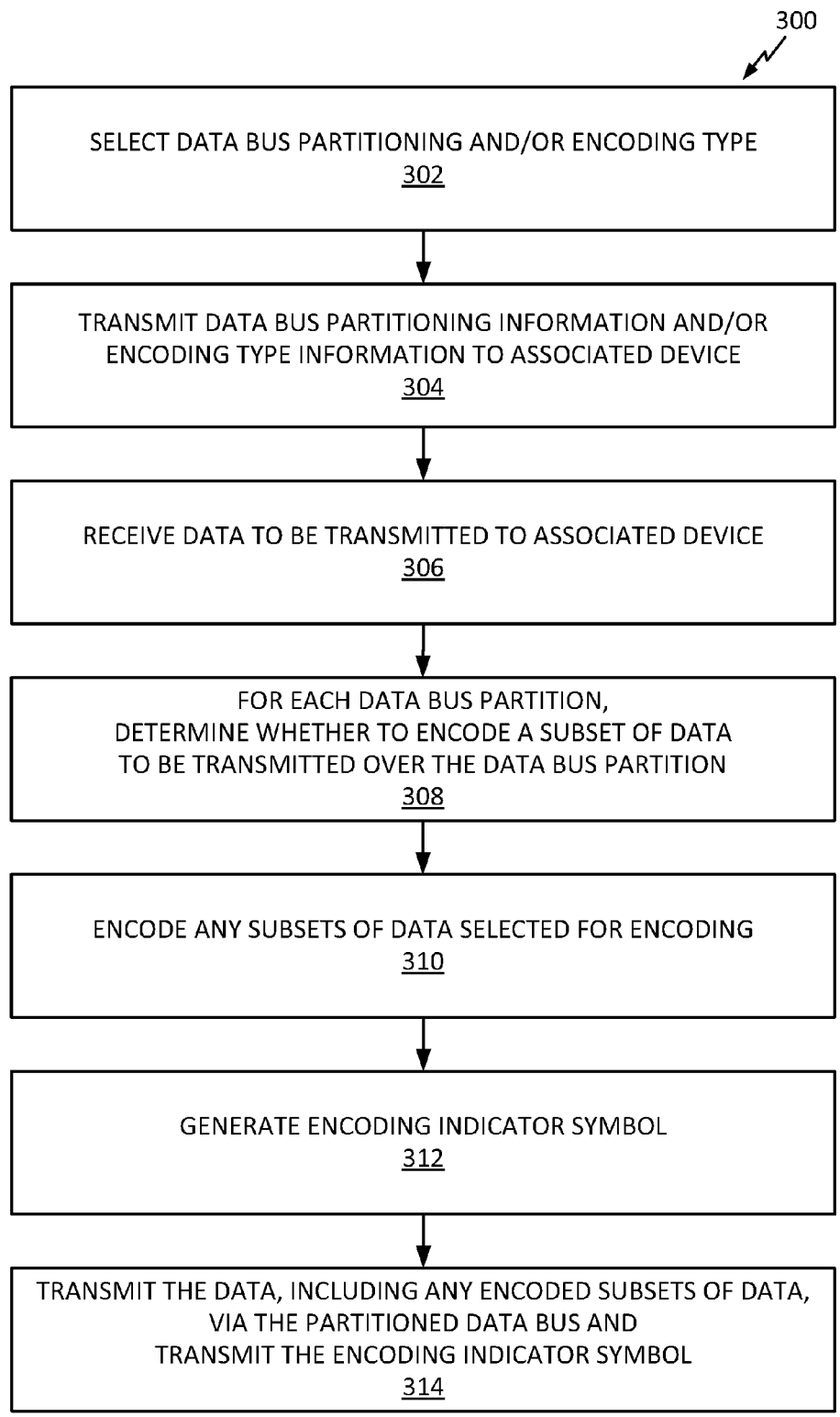
FIG. 3 is a flowchart illustrating operations that may be performed in conjunction with encoding data according to at least one example of the present disclosure.

FIG. 3 illustrates an example of operations that may be performed in conjunction with selectively encoding data and generating a corresponding encoding indicator symbol. For example, the operations of FIG. 3 could be performed by the transmitter 108 of FIG. 1, the encoder 202 of FIG. 2, or some other suitable entity.

Block 302 relates to several preliminary operations that are performed prior to a data transfer. A designated component selects the particular data partitioning to be employed on the data bus and the type of encoding to be applied to data sent over the bus partitions.

These operations are performed on a static basis in some implementations. For example, a data bus controller could define these parameters when the corresponding system is initialized. As another example, a manufacturer could configure a system to always use the same parameters.

In other implementations, the operations of block 302 are performed on a dynamic basis. For example, a transmitter, an encoder, or some other component could specify the partitioning and/or encoding to be used for certain data transfers, for certain periods of time, or for other specified conditions.

The basis of the decision of block 302 can be based on one or more factors. As one example, the encoding or partitioning may depend on the type of data being transferred, the data rate, or some other data-related or non-data-related factor.

In block 304, the device that performs the selection of block 302 transmits the data bus partitioning information and/or the encoding type information to an associated device. Here, through the use of appropriate signaling between associated components (e.g., a dedicated bit line between an encoder and a decoder, or a command bus), one component can inform its associated component of the specific partitioning to be used and/or the type of encoding to be applied to the partitioned data bus for data transfers.

In block 306, at some point in time, a first device receives data to be transmitted to an associated second device. For example, a memory controller may receive data from a system processor for transfer to a memory device. It should be appreciated that the teachings herein are applicable to other forms of data transfers as well.

In block 308, for each data bus partition, the first device determines whether to encode the subset of the received data to be transmitted over that data bus partition. For example, an encoder of the first device may analyze the subset of data to be sent over a given data bus partition and thereby decide whether that subset of data is to be encoded.

In block 310, an encoder encodes any subsets of data designated for encoding at block 308. Any subsets of data not designated for encoding at block 308 are not encoded.

In block 312, the encoder or an associated component generates an encoding indicator symbol based on the results of blocks 308 and 310. As discussed herein, the encoding indicator symbol indicates both bus partitioning and encoding being applied to each bus partition.

In block 314, the first device transmits the data received at block 306, optionally modified by any encoding performed on one or more subsets of the received data at block 310, via the partitioned data bus. In conjunction with this data transmission, the first device transmits the corresponding encoding indicator symbol that was generated at block 312. Typically, the first device transmits the data and the associated encoding indicator symbol in parallel (e.g., at substantially the same time). However, if desired, the encoding indicator symbol could be transmitted before or after the data.

Figure 4:
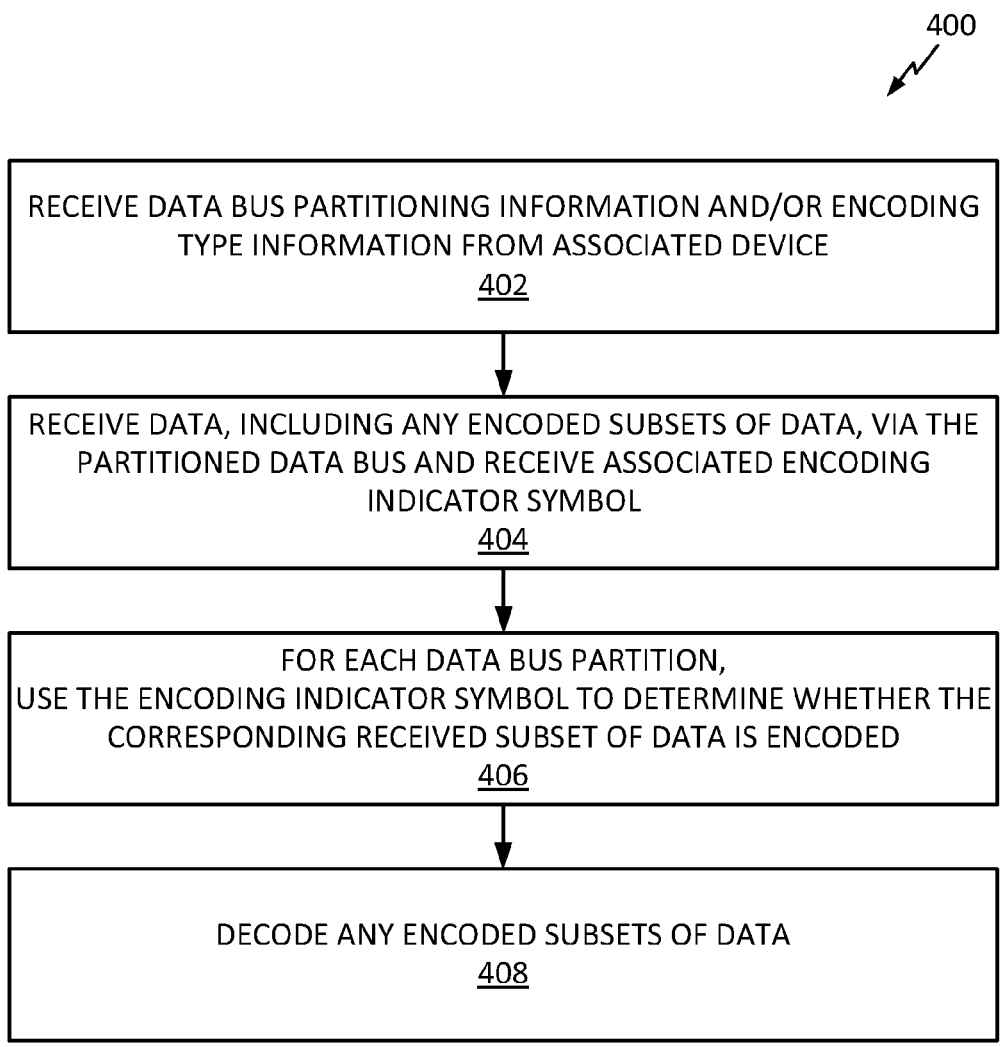
FIG. 4 is a flowchart illustrating operations that may be performed in conjunction with decoding data according to at least one example of the present disclosure.

FIG. 4 illustrates an example of operations that may be performed in conjunction with selectively decoding received data based on a received encoding indicator symbol. For example, the operations of FIG. 4 could be performed by the receiver 112 of FIG. 1, the decoder 204 of FIG. 2, or some other suitable entity.

In block 402, the second device referred to above receives the data bus partitioning information and/or the encoding type information transmitted at block 304 of FIG. 3. In this way, the second device determines how decoding is to be applied to data received via a partitioned data bus.

In block 404, the second device receives data from the first device via the partitioned data bus, as well as the associated encoding indicator symbol. As mentioned above, one or more subsets of data received on one or more of the data bus partitions may be encoded.

In block 406, for each data bus partition, the second device uses the encoding indicator symbol to determine whether a corresponding subset of the data received at block 402 is encoded.

In block 408, a decoder decodes any subsets of data identified at block 404 as being encoded. Any subsets of data that were not identified as being encoded at block 406 are not decoded. The second device may then use the received data for its intended purpose.

As mentioned above, the teachings herein can be implemented using different types of encoding in different implementations. For purposes of illustration, additional details relating to the generation and use of an encoding indicator symbol will now be described in the context of DBI encoding. It should be appreciated, however, that the teachings herein are not limited to DBI encoding.

Figure 5:
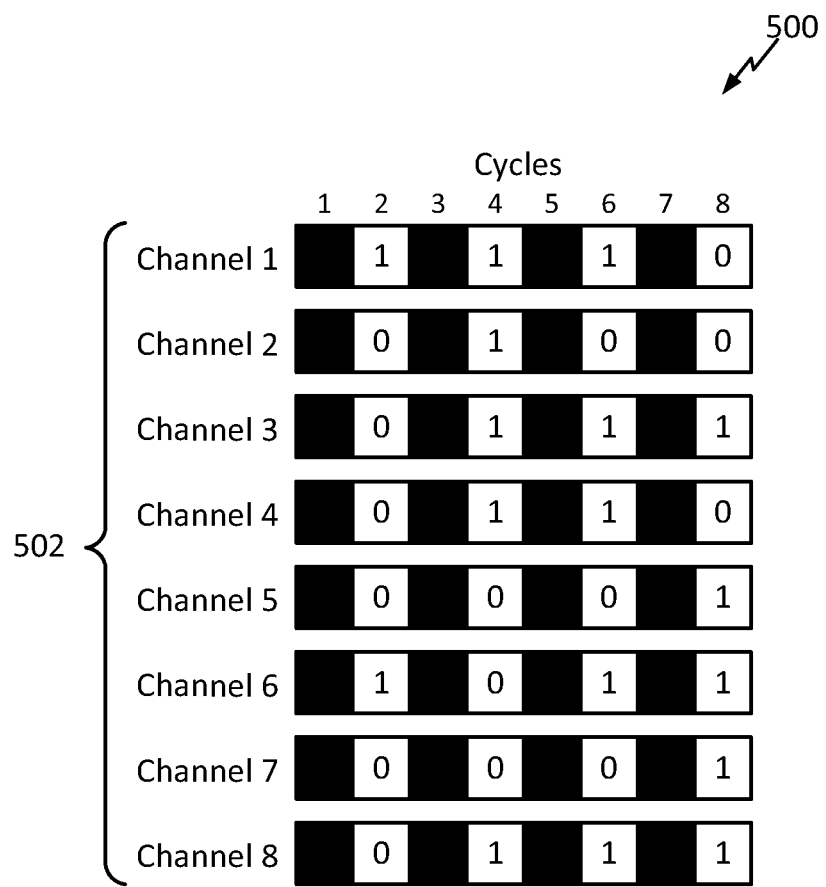
FIG. 5 is a simplified diagram illustrating an example of data bits transmitted over different channels of a data bus.
Figure 6:
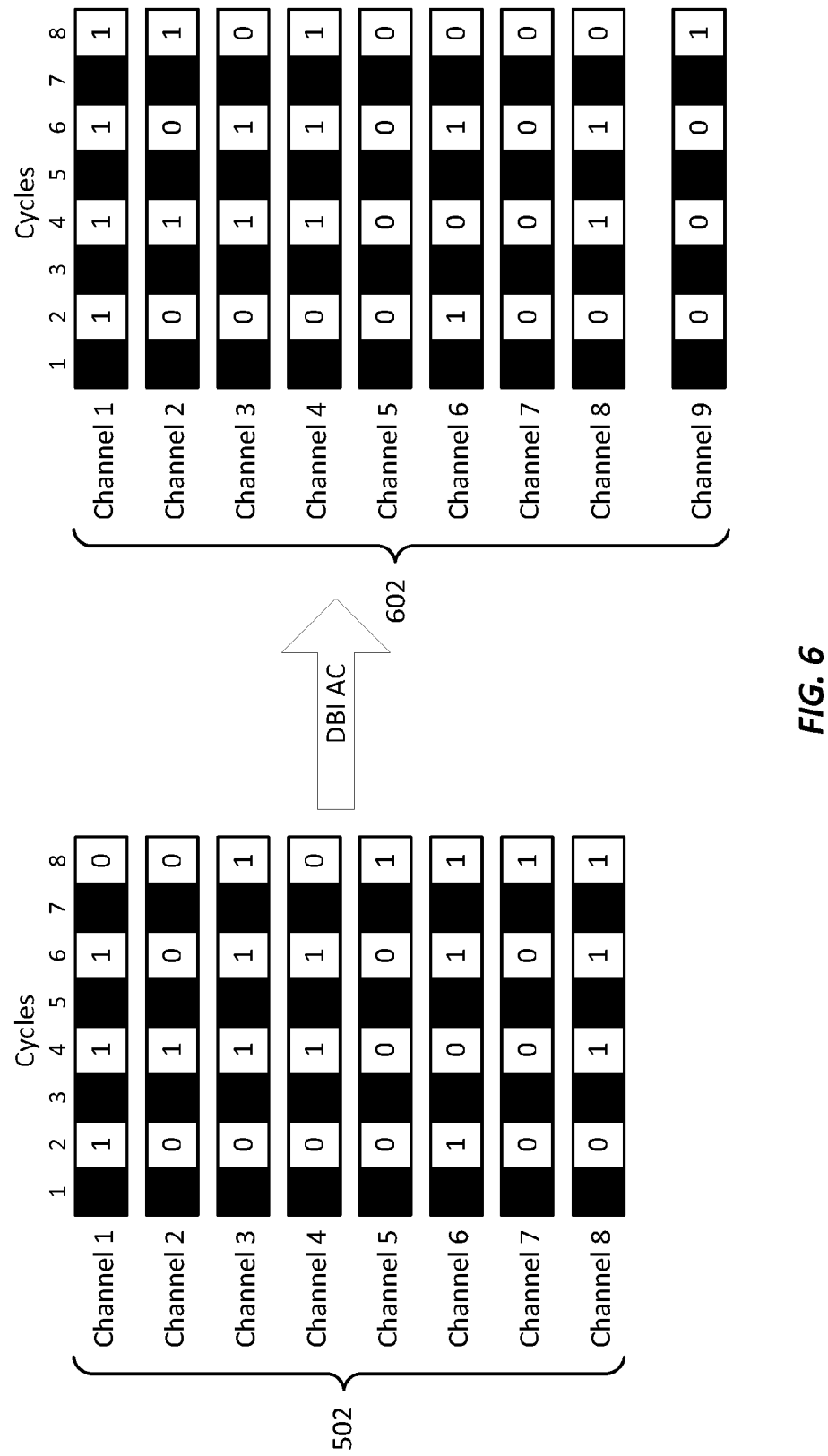
FIG. 6 is a simplified diagram illustrating an example of conventional DBI AC encoding applied to the data bits of FIG. 5.
Figure 7:
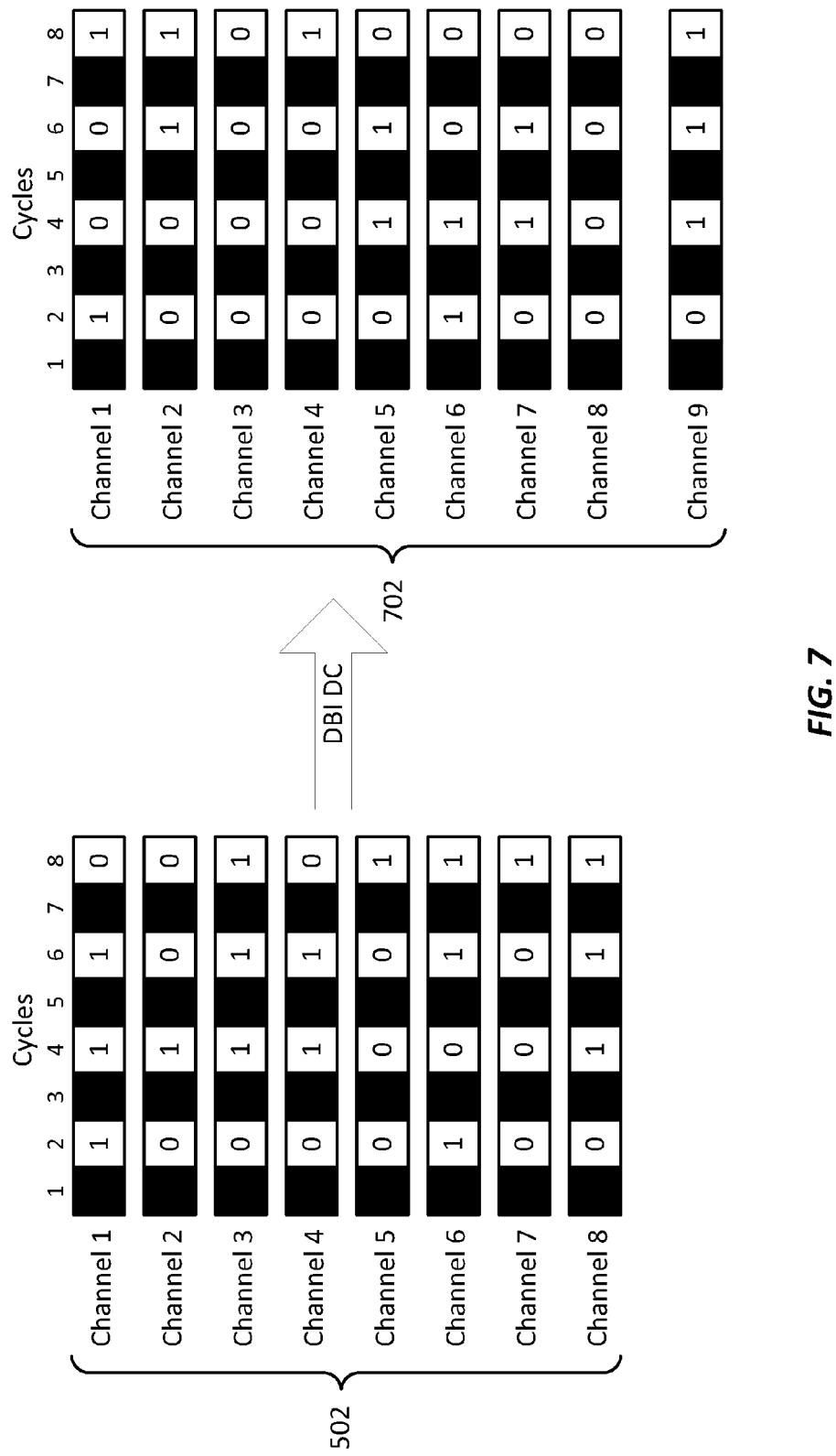
FIG. 7 is a simplified diagram illustrating an example of conventional DBI DC encoding applied to the data bits of FIG. 5.

FIGS. 5-7 present an overview of conventional DBI encoding. FIG. 5 is a block diagram 500 illustrating an example of data bits transmitted over different channels of a data bus 502 (e.g., the data bus 106 of FIG. 1). As illustrated, each row represents a separate data channel, with eight data bits or cycles shown as transmitted on each channel. The odd-numbered cycles or bits are shaded simply to facilitate easier viewing.

Data bus inversion is a feature that employs circuitry to look at the relationship between bits to be transmitted, and then decide if it would be advantageous to invert some or all of the bits prior to transmission. If the bits are inverted, an additional signal is also set to indicate that the bits are inverted. This additional signal is often referred to as a data bus inversion (DBI) flag or an encoding flag. An extra channel can be used so the DBI flag can be sent in parallel with the other bits to identify to the receiving circuitry which sets of data have been inverted. The receiver uses the DBI flag to return the incoming data to its original state.

There are generally two types of data bus inversion techniques used for DBI encoding. The first technique, which may be referred to by those of skill in the art as DBI AC or minimum transitions, is used to reduce the number of transitions on a data channel (e.g., changes from a "zero" to a "one," or from a "one" to a "zero") to improve AC power consumption and reduce issues from crosstalk, etc. FIG. 6 is a block diagram illustrating an example of conventional DBI AC encoding. On the left is the raw data from FIG. 5, and the right-side shows the resulting encoded data 602. DBI AC encoding is typically employed to reduce the number of simultaneous transitions. In the raw data, there are a total of 34 transitions through the eight cycles on all eight channels of the data bus 502. As shown, when a device determines that the data scheduled for transmission on more than half of the data channels have a transition from one cycle to the next, the device can invert the next cycle on all the data channels. For instance, from cycle 2 to cycle 3, seven of the eight data channels have a transition, either from a "one" to a "zero" or from a "zero" to a "one." Accordingly, the device can invert cycle 3, so that only one of the eight data channels will have a transition. Additionally, a DBI flag is set at cycle 3 on the DBI control channel identified as channel 9 in FIG. 6. In this example, the number of transitions in the data transmitted on the data bus 502 decreases from 34 to 25, but the number of "ones" (e.g., logic HIGH signals) transmitted on the data bus 502 increases from 31 to 32.

The second technique for data bus inversion, which may be referred to as DBI DC, minimum "ones," or minimum "zeros," is used to reduce the number of data bits of a particular state (e.g., reduce the number of "ones" or the number of "zeros"). FIG. 7 is a block diagram illustrating an example of conventional DBI DC encoding. Once again, the diagram on the left is the raw data from FIG. 5 and the diagram on the right illustrates the resulting encoded data 702. DBI DC encoding is typically employed to reduce the number of data bits having a particular state. For instance, in this example the DBI DC is employed to reduce number of "ones" (or logical HIGH signals) transmitted on the data bus 502. As shown, when a device determines that more than half of the data channels have a logical HIGH signal (a "one") on a given cycle, then the device can invert the cycle for all data channels. For instance, cycle 1 in the raw data has logical HIGH signals ("ones") on five of the eight data channels. Accordingly, the device can invert cycle 1 on each of the data channels so that only three of the eight data channels will transmit a logical HIGH signal (a "one"). Additionally, a DBI flag is set at cycle 1 on the DBI control channel identified as channel 9 in FIG. 7. In this example, the number of "ones" (e.g., logical HIGH signals) transmitted on the data bus 502 is reduced from 31 to 22. The number of transitions also decreases from 34 to 28 in this example, although this example is not typical for this technique. Generally, this technique results in an increase in the number of transitions.

Figures 8, 9:
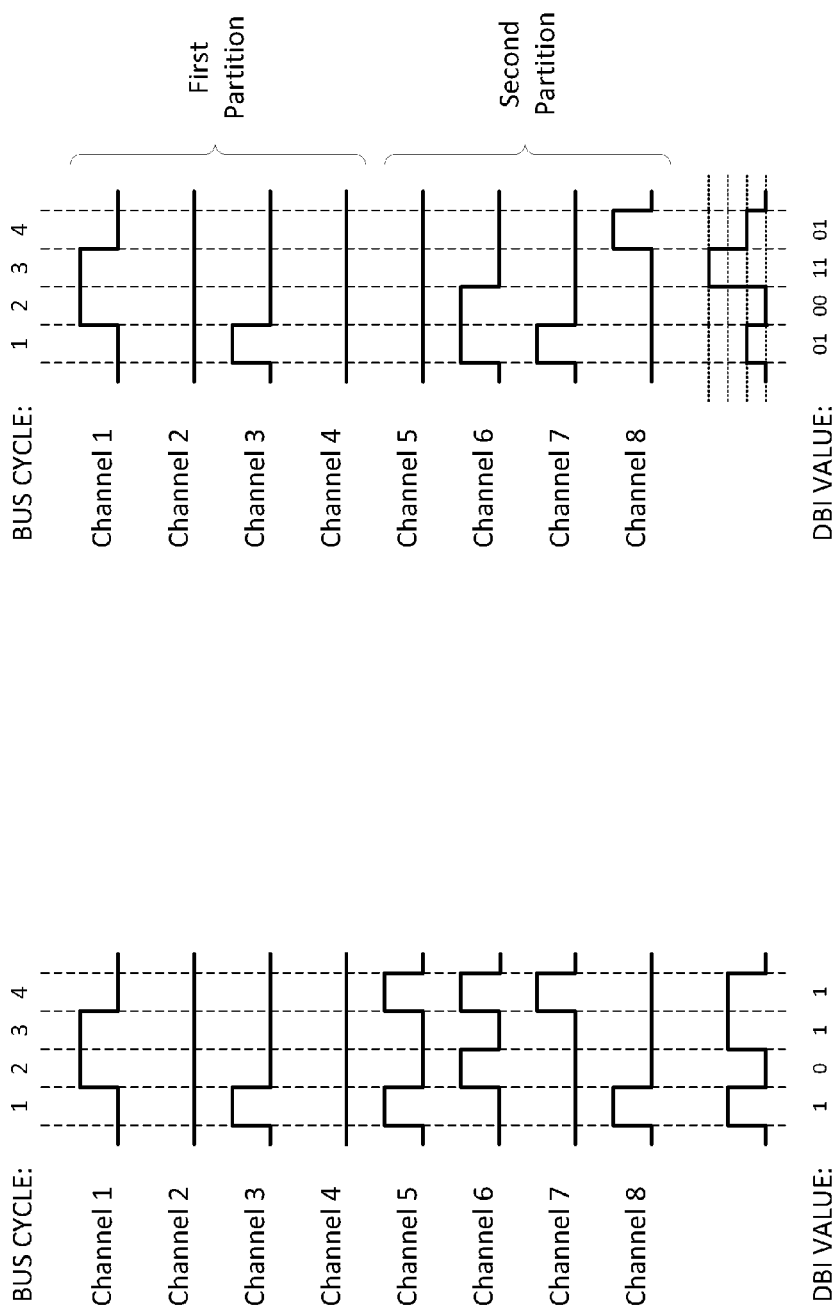
FIG. 8 is a simplified diagram illustrating signaling for an example of conventional DBI DC encoding applied to a portion of the data bits of FIG. 5.
FIG. 9 is a simplified diagram illustrating signaling for encoding applied to a portion of the data bits of FIG. 5 according to at least one example of the present disclosure.

FIG. 8 illustrates an example of binary signaling employed in conventional DBI encoding. In particular, FIG. 8 illustrates, in a simplified manner, signaling associated with the first four bus cycles of the DBI DC output from FIG. 7, along with the corresponding DBI values from the DBI control channel.

By way of contrast, FIG. 9 illustrates an example of signaling that may be employed in conjunction with the use of an encoding indicator symbol as taught herein. In this example, each encoding indicator symbol (DBI value) takes one of four values (levels) as indicated at the bottom of FIG. 9. These values are the same as the encoding indicator symbol values described above with reference to FIG. 2. Thus, this encoding indicator symbol can be used in conjunction with bus partitioning, whereby a given encoding indicator symbol indicates, for each bus partition, whether encoding has been applied to that particular bus partition.

In the example of FIG. 9, the 8 channels have been partitioned into two 2 partitions. The first partition consists of channels 1-4 and the second partition consists of channels 5-8. In bus cycle 1, encoding is applied only to the first partition. In bus cycle 2, no encoding is applied. In bus cycle 3, encoding is applied to both the first partition and the second partition. In bus cycle 4, encoding is applied only to the first partition.

The waveforms illustrated for channels 1-8 in FIG. 9 correspond to the use of DBI DC encoding. In particular, DBI DC encoding is applied selectively to each bus partition for each of the first four cycles of FIG. 5. Here, it may be seen that the use of bus partitioning results in fewer "ones" (a high signal level in this example) than the conventional DBI DC implementation of FIG. 8. Specifically, in FIG. 8 there are nine "ones" while in FIG. 9 there are seven "ones." Thus, the implementation of FIG. 9 generally provides better performance than the implementation of FIG. 8, while using the same number of bit lines (or device pins).

A multi-level encoding indicator symbol can be implemented in various ways. For example, a multi-level encoding indicator symbol may be defined by multiple voltage levels, multiple current levels, multiple phase levels (e.g., phase shifts), or a combination thereof. FIGS. 10-15 illustrate several examples of circuits that can be used to generate a multi-level encoding indicator symbol.

Figure 10:
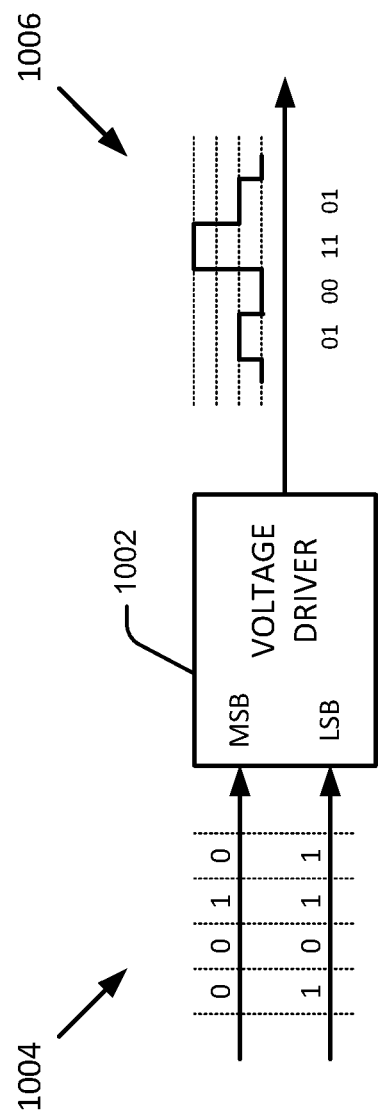
FIG. 10 is a simplified diagram illustrating a circuit for generating a multi-level indicator according to at least one example of the present disclosure.

FIG. 10 is a simplified diagram of a multi-level voltage driver 1002 capable of generating an encoding indicator symbol at different voltage levels. A two bit (MSB and LSB) input control signal 1004 controls the output 1006 of the voltage driver 1002. Specifically, an input value of 00 results in a level 0 output voltage (e.g., 0 volts), an input value of 01 results in a level 1 output voltage, an input value of 10 results in a level 2 output voltage, and an input value of 11 results in a level 3 output voltage (e.g., maximum amplitude). A complementary multi-voltage level receiver circuit (not shown) could be used to receive the multi-level encoding indicator symbol.

Figure 11:
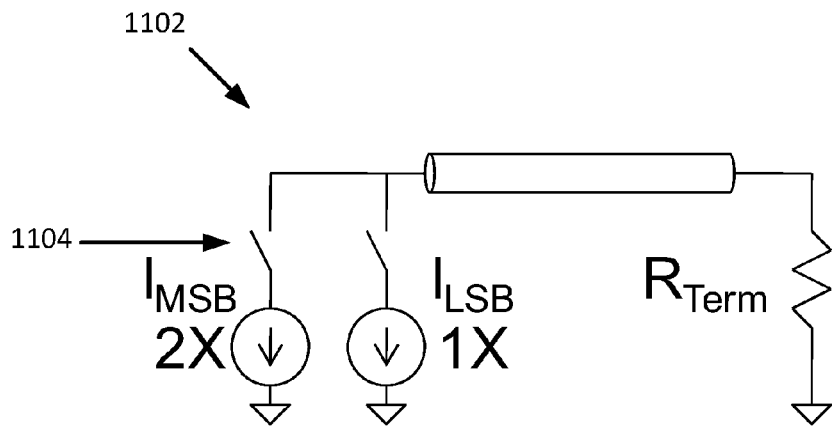
FIG. 11 is a simplified diagram illustrating another circuit for generating a multi-level indicator according to at least one example of the present disclosure.

FIG. 11 is a simplified diagram of a multi-level current driver 1102 capable of generating an encoding indicator symbol at different current levels. A two bit input control (represented by the two switches 1104) controls whether the supply currents $I_{MSB}$ and $I_{LSB}$ are coupled to the output represented by the termination resistance ($R_{Term}$). In this example, $I_{MSB}$ is twice the magnitude of $I_{LSB}$. A complementary multi-current level receiver circuit (not shown) could be used to receive the multi-level encoding indicator symbol.

Figure 12:
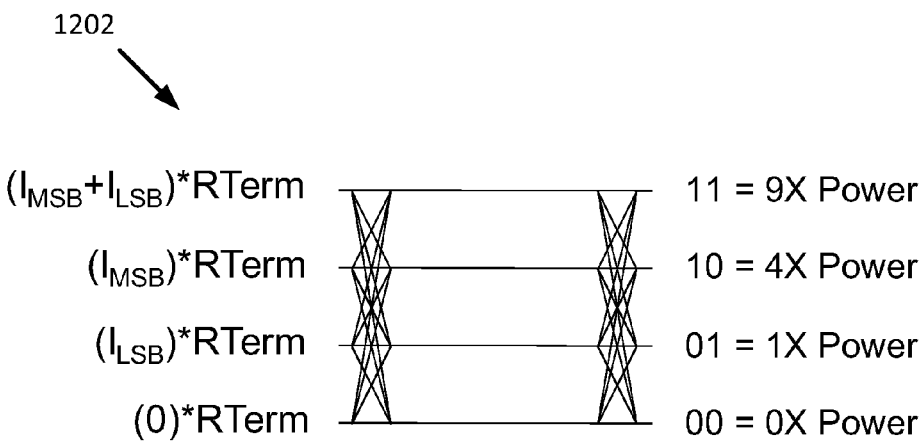
FIG. 12 is a simplified diagram illustrating examples of output levels generated by the circuit of FIG. 11.

FIG. 12 illustrates the four current levels 1202 that can be generated by the current driver 1102. Specifically, an input value of 00 results in a level 0 output current (corresponding to 0× power), an input value of 01 results in a level 1 output current (corresponding to 1× power), an input value of 10 results in a level 2 output current (corresponding to 4× power), and an input value of 11 results in a level 3 output current (corresponding to 9× power).

Figure 13:
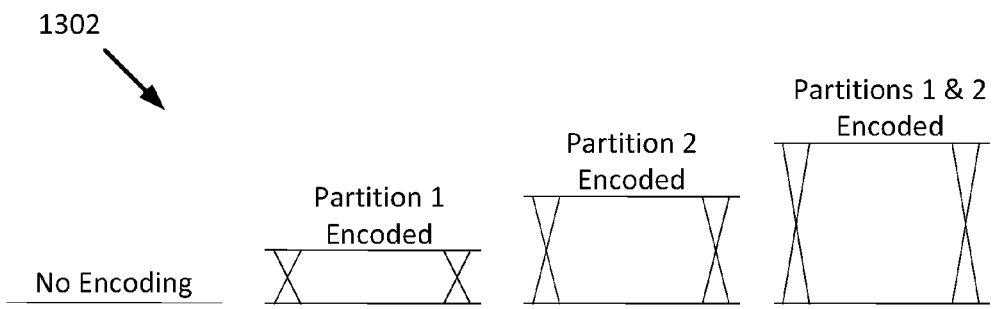
FIG. 13 is a simplified diagram illustrating examples of DBI levels generated by the circuit of FIG. 11.

FIG. 13 illustrates four DBI values 1302 that can map to the current levels 1202 of FIG. 12. Specifically, a level 0 output current indicates that neither the first bus partition (designated partition 1) nor the second bus partition (designated partition 2) has been encoded ("inverted" in the case of DBI). A level 1 output current indicates that only the first bus partition has been encoded. A level 2 output current indicates that only the second bus partition has been encoded. A level 3 output current indicates that both the first bus partition and the second bus partition have been encoded.

Figure 14:
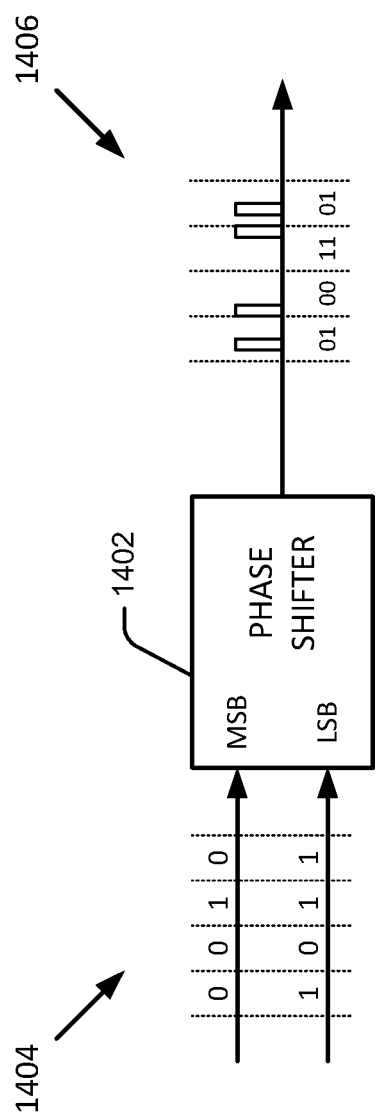
FIG. 14 is a simplified diagram illustrating another circuit for generating a multi-level indicator according to at least one example of the present disclosure.

FIG. 14 is a simplified block diagram of a multi-state (or multi-level) phase shifter 1402 capable of generating an encoding indicator symbol at different phase shifts. A two bit (MSB and LSB) input control signal 1404 controls the output 1406 of the phase shifter 1402. Specifically, an input value of 00 results in a state 0 (level 0) phase shift (e.g., no phase shift), an input value of 01 results in a state 1 (level 1) phase shift (e.g., 90 degree phase shift), an input value of 10 results in a state 2 (level 2) phase shift (e.g., 180 degree phase shift), and an input value of 11 results in a state 3 (level 3) phase shift (e.g., 270 degree phase shift). A complementary multi-phase level receiver circuit (not shown) could be used to receive the multi-level encoding indicator symbol.

Figure 15:
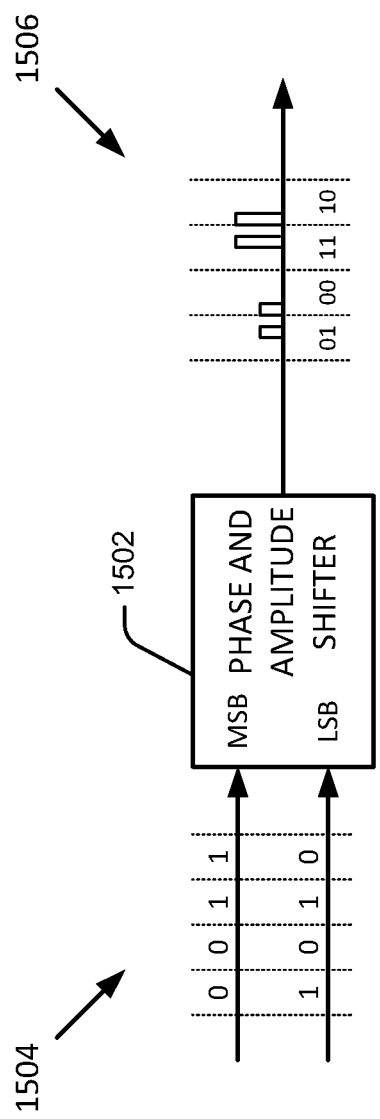
FIG. 15 is a simplified diagram illustrating another circuit for generating a multi-level indicator according to at least one example of the present disclosure.

FIG. 15 is a simplified block diagram of a multi-state (or multi-level) phase and amplitude shifter 1502 capable of generating an encoding indicator symbol at different phase shifts and amplitudes. A two bit (MSB and LSB) input control signal 1504 controls the output 1506 of the phase and amplitude shifter 1502. Specifically, an input value of 00 results in a state 0 (level 0) phase shift (e.g., no phase shift) and amplitude (e.g., a low amplitude value), an input value of 01 results in a state 1 (level 1) phase shift (e.g., 180 degree phase shift) and amplitude (e.g., a low amplitude value), an input value of 10 results in a state 2 (level 2) phase shift (e.g., no phase shift) and amplitude (e.g., a high amplitude value), and an input value of 11 results in a state 3 (level 3) phase shift (e.g., 180 degree phase shift) and amplitude (e.g., a high amplitude value). A complementary multi-state receiver circuit (not shown) could be used to receive the multi-level encoding indicator symbol. It should be appreciated that different combinations of phases and amplitudes (other than two phases and two amplitudes) could be used in different implementations.

Figure 16:
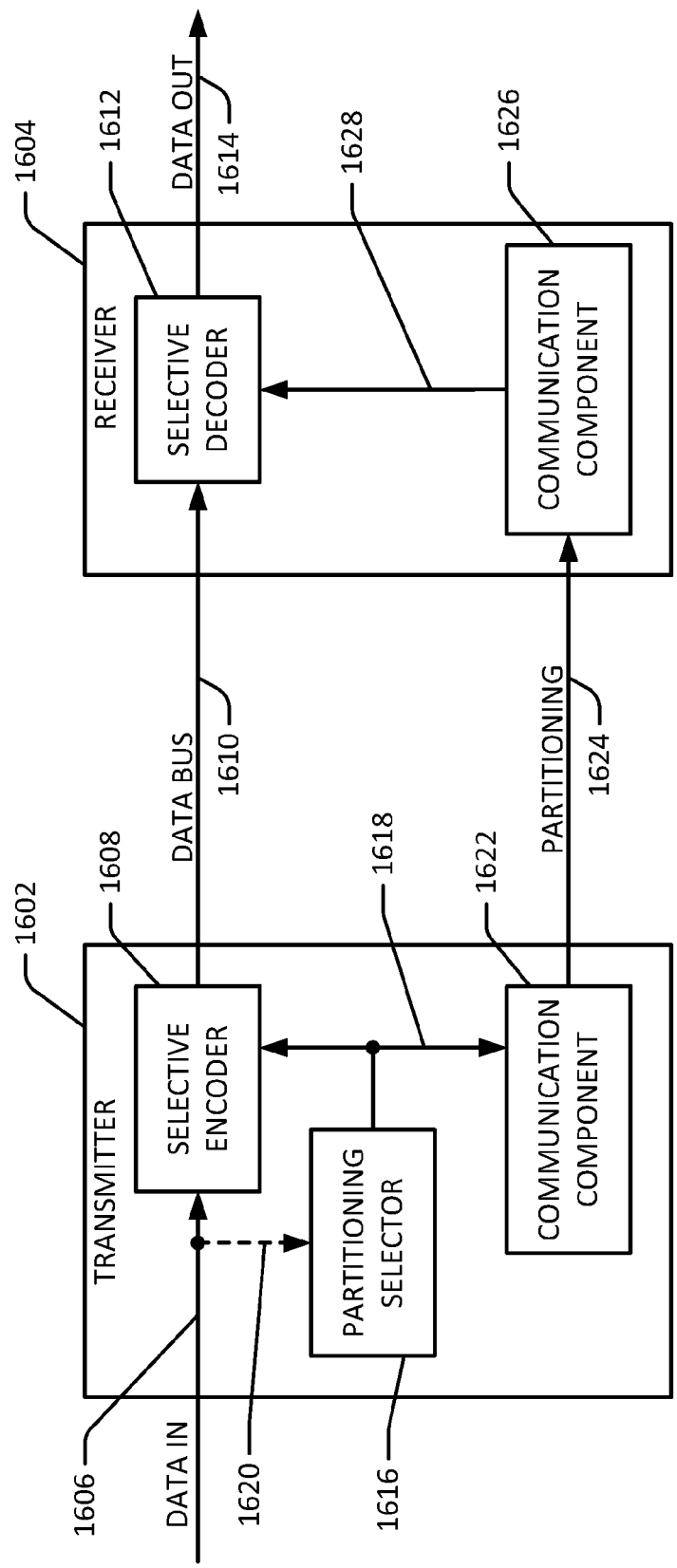
FIG. 16 is a simplified diagram illustrating a circuit for selecting a bus partitioning format according to at least one example of the present disclosure.

As mentioned above, in some implementations, the partitioning employed on a data bus is selected (e.g., dynamically selected) by a designated system component. FIG. 16 illustrates an example of a transmitter 1602 that includes bus partitioning selection functionality. It should be appreciated that the bus partitioning selection functionality taught herein is not limited to this example. Rather, in other implementations, bus partitioning selection functionality may be implemented in other components (e.g., a receiver 1604 or some other component).

The transmitter 1602 receives data (DATA IN) via an input data bus 1606, whereupon a selective encoder 1608 selectively applies encoding to different subsets of data to be transmitted via different bus partitions of a data bus 1610. Upon receipt of this data, a selective decoder 1612 of the receiver 1604 selectively applies decoding to different subsets of data received via different bus partitions of the data bus 1610 based on an associated encoding indicator symbol (not shown) as taught herein to provide output data (DATA OUT) on an output data bus 1614.

The transmitter 1602 includes a partitioning selector 1616 that is configured to select the particular partitioning format to be employed on the data bus 1610. For example, the partitioning selector 1616 may select the number of bus partitions to be used as well as the number of bit lines for each bus partition. As noted above, the number of bit lines in different bus partitions may differ. In some implementations, the partitioning selector 1616 selects the partitioning format from a set of supported portioning formats.

The selection of a particular bus partitioning may be based on various factors. For example, bus partitioning may be affected by signal line (trace) routing constraints, inter-line interference considerations, and so on. Also, different bus partitioning may be employed for different system configurations, for different periods of time, or for other specified conditions. Also, as indicated by the data line 1620 in FIG. 16, in some implementations, the particular bus partitioning to be used may be based on the data to be sent over the partitioned data bus. For example, the partitioning may depend on the type of data being transferred, the data rate, or some other data-related factor. It should be appreciated that the signal lines of a given partition need not be routed together (i.e., next to one another). For example, odd numbered signal lines could be allocated to one partition and even numbered signal lines allocated to another partition. Such a configuration may be particularly beneficial in DBI-AC environments, as the odd/even partitioning could reduce the odd/even phase crosstalk.

Once the partitioning selector 1616 selects the bus partitioning, the partitioning selector 1616 sends an indication of the selected partitioning to the selective encoder 1608 and a communication component 1622 (e.g., a bus driver circuit). The communication component 1622 then sends the partitioning indication via an appropriate signal path 1624 (e.g., a control bus) to a corresponding communication component 1626 (e.g., a bus receiver circuit) of the receiver 1604. The communication component 1626, in turn, sends the partitioning indication to the selective decoder 1612 via an appropriate signal path 1628. In this way, the partitioning to be used on the data bus 1610 is communicated to both the selective encoder 1608 and the selective decoder 1612.

Figure 17:
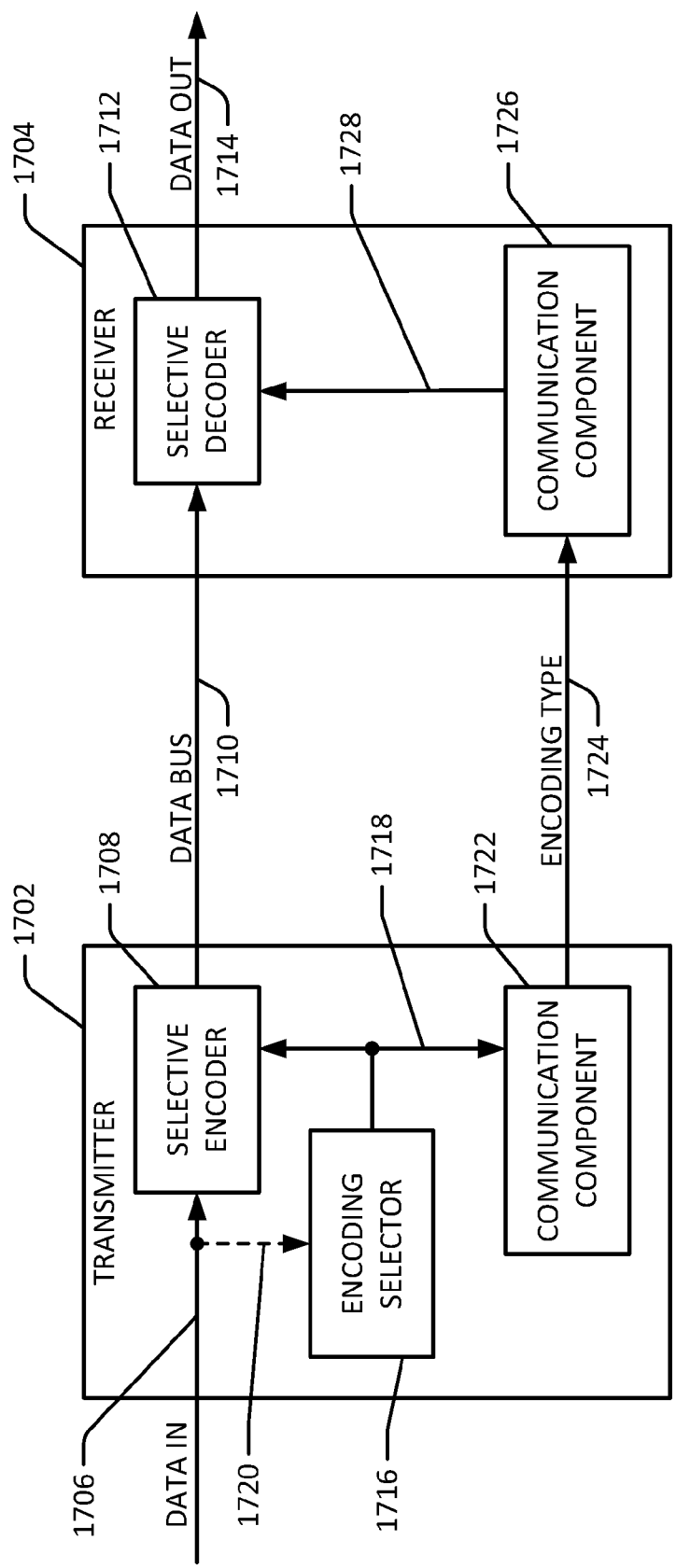
FIG. 17 is a simplified diagram illustrating a circuit for selecting a type of encoding according to at least one example of the present disclosure.

In some implementations, the encoding employed on a data bus is selected (e.g., dynamically selected) by a designated system component. FIG. 17 illustrates an example of a transmitter 1702 that includes encoding selection functionality. It should be appreciated that the encoding selection functionality taught herein is not limited to this example. Rather, in other implementations, encoding selection functionality may be implemented in other components (e.g., a receiver 1704 or some other component).

The transmitter 1702 receives input data (DATA IN) via an input data bus 1706, whereupon a selective encoder 1708 selectively applies encoding to different subsets of data to be transmitted via different bus partitions of a data bus 1710. Upon receipt of this data, a selective decoder 1712 of the receiver 1704 selectively applies decoding to different subsets of data received via different bus partitions of the data bus 1710 based on an associated encoding indicator symbol (not shown) as taught herein to provide output data (DATA OUT) on an output data bus 1714.

The transmitter 1702 includes an encoding selector 1716 that is configured to select the particular encoding to be employed on the data bus 1710. For example, the encoding selector 1716 may select a type of encoding from a set of supported encoding types (e.g., DBI AC, DBI DC, etc.). In some implementations, the encoding selector 1716 selects one type of encoding to be applied on the entire data bus 1710 (i.e., all bus partitions). In some implementations, the encoding selector 1716 may select different types of encoding for different bus partitions.

The selection of a particular encoding may be based on various factors. For example, different types of encoding may be employed for different channel conditions, different operating conditions, different system configurations, different periods of time, or other specified conditions. As indicated by the data line 1720 in FIG. 17, in some implementations, the particular encoding to be used may be based on the data to be sent over the partitioned data bus 1710. For example, the type of encoding selected may depend on the type of data being transferred, the data rate, or some other data-related factor.

Once the encoding selector 1716 selects the encoding, the encoding selector 1716 sends an indication of the selected encoding to the selective encoder 1708 and a communication component 1722 (e.g., a bus driver circuit). The communication component 1722 then sends the encoding indication via an appropriate signal path 1724 (e.g., a control bus) to a corresponding communication component 1726 (e.g., a bus receiver circuit) of the receiver 1704. The communication component 1726, in turn, sends the encoding indication to the selective decoder 1712 via an appropriate signal path 1728. In this way, the encoding to be used on the data bus 1710 is communicated to both the selective encoder 1708 and the selective decoder 1712.

As mentioned above, in some implementations (e.g., where the encoding indicator symbol represents more than four levels), one or more of the "levels" of the encoding indicator symbol may indicate the type of encoding to be applied to a corresponding bus partition. Thus, in these implementations, the signal path 1724 may comprise a DBI flag bit line (or pin) or other comparable encoding indicator bit line.

Figure 18:
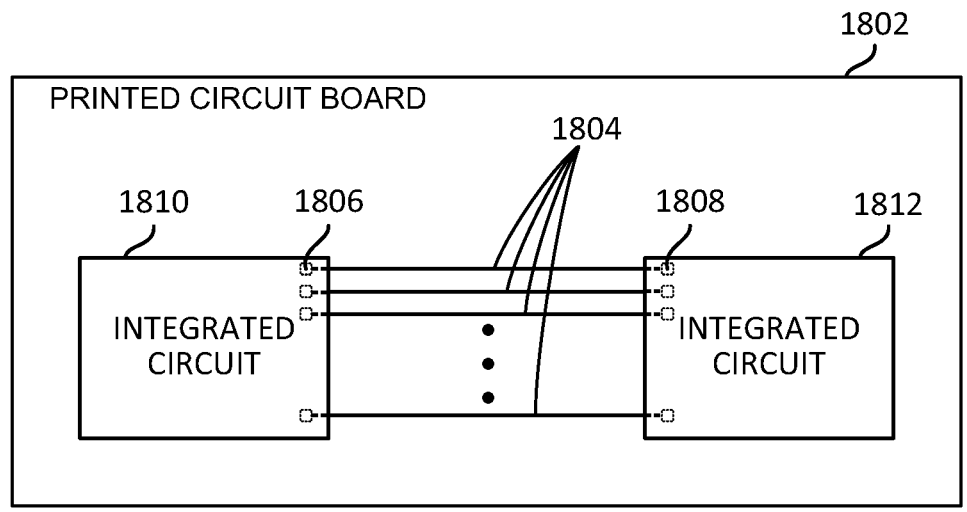
FIG. 18 is a simplified diagram illustrating a printed circuit board incorporating a data bus according to at least one example of the present disclosure.
Figure 19:
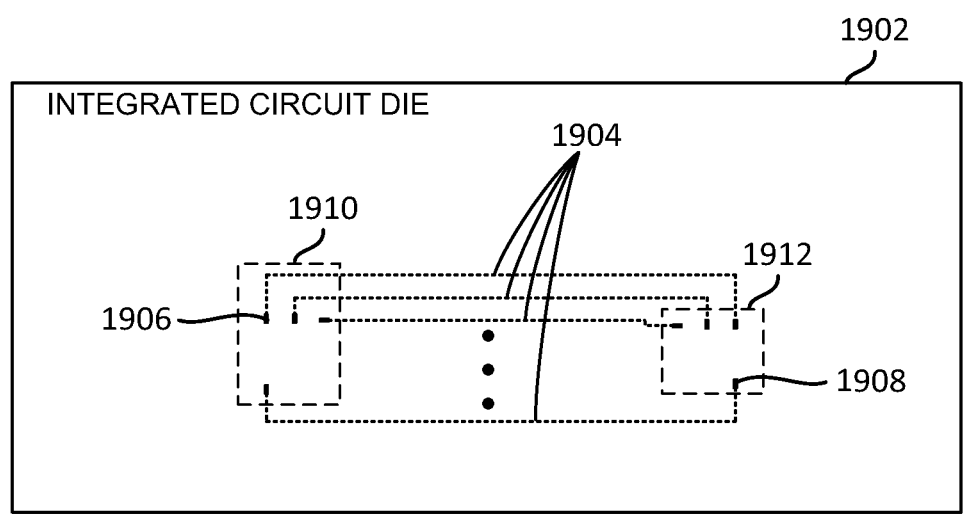
FIG. 19 is a simplified diagram illustrating an integrated circuit die incorporating a data bus according to at least one example of the present disclosure.

A data bus incorporating a multi-level encoding indicator symbol can be implemented in various ways. For example, the data bus may be implemented within a printed circuit board, within an integrated circuit die, or within some other suitable structure. FIGS. 18 and 19 illustrate examples of printed circuit board and integrated circuit die implementations.

In FIG. 18, a printed circuit board 1802 incorporates a data bus implemented as a number of wires 1804 (also called traces) placed on one or more layers of the printed circuit board 1802. In this example, the data bus wires 1804 are routed from pads (e.g., a first pad 1806 and a second pad 1808) to which contacts of a first integrated circuit 1810 and a second integrated circuit 1812 are connected. It should be appreciated that the wires of a data bus may be routed in a different manner in other implementations. For example, in some implementations a data bus is routed between a circuit and an off-board connector (not shown).

In FIG. 19, an integrated circuit die 1902 incorporates a data bus implemented as a number of wires 1904 (also called traces) deposited on one or more layers of the die 1902. In this example, the data bus wires 1904 are routed between interconnects (e.g., a first interconnect 1906 and a second interconnect 1908) to which a first circuit 1910 and a second circuit 1912 connect. It should be appreciated that the wires of a data bus may be routed in a different manner in other implementations. For example, in some implementations a data bus is routed between an internal circuit of the die 1902 and a bond pad of the die for connection to an external circuit (not shown).

Figure 20:
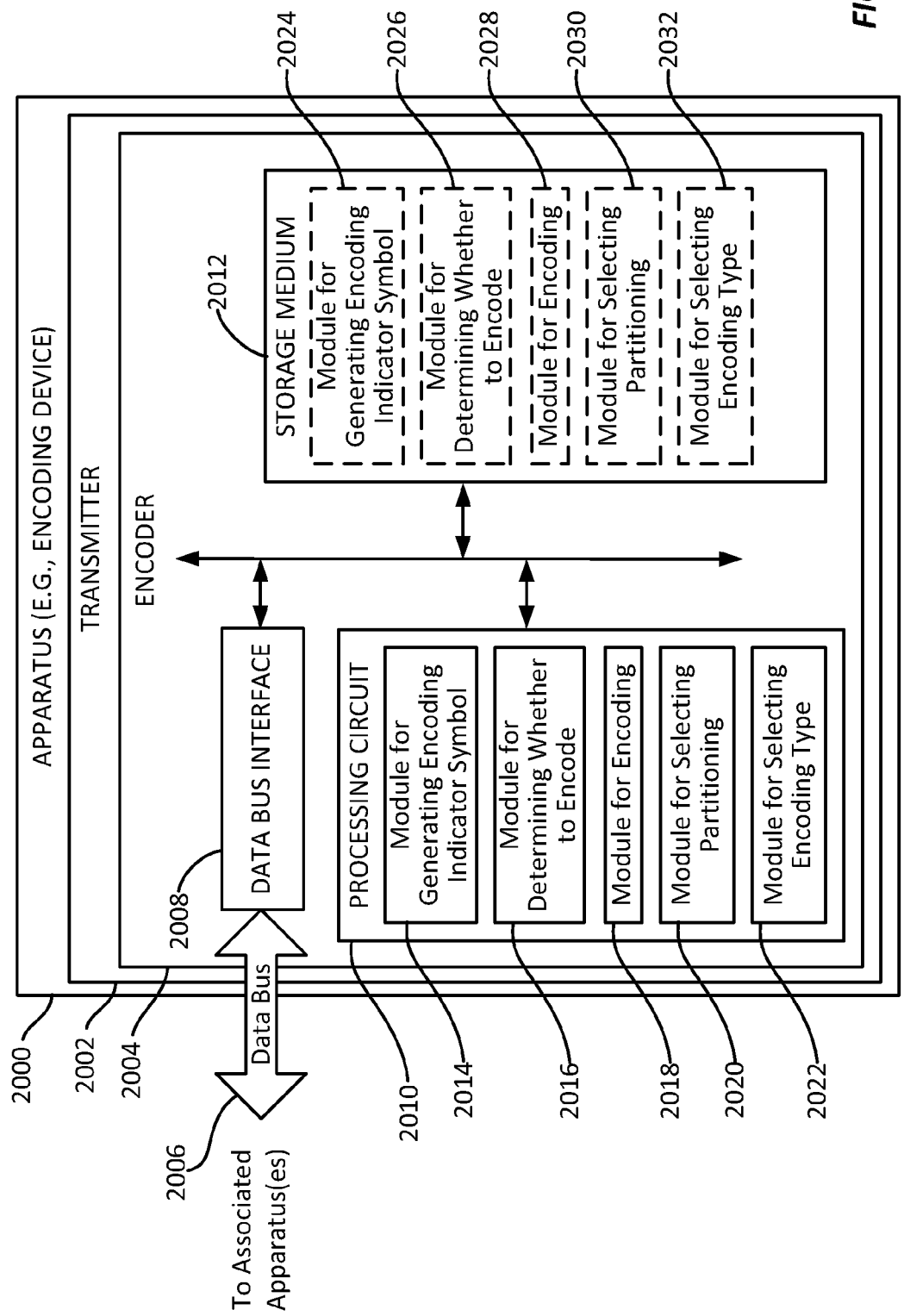
FIG. 20 is a simplified block diagram illustrating select components of an apparatus including encoding functionality according to at least one example of the present disclosure.

Turning to FIG. 20, a block diagram is shown illustrating select components of an apparatus 2000, such as the first or second electronic device 102 or 104 from FIG. 1 according to at least one example of the present disclosure. A transmitter 2002 of the apparatus 2000 includes an encoder 2004 adapted to transmit data bits over a plurality of channels of a data bus 2006.

The encoder 2004 generally includes circuitry and/or programming adapted to encode data and generate an associated encoding indicator symbol. According to at least one example, the encoder 2004 may be coupled to a plurality of data channels of the data bus 2006 by a data bus interface 2008, and may include a processing circuit 2010 coupled to or placed in electrical communication with the data bus interface 2008 and a storage medium 2012. The data bus interface 2008 may include, for example, one or more of: signal driver circuits, signal receiver circuits, amplifiers, signal filters, signal buffers, or other circuitry used to interface with a signaling bus or other types of signaling media.

The processing circuit 2010 is arranged to obtain, process and/or send data, control data access and storage, issue commands, and control other desired operations. The processing circuit 2010 may include circuitry adapted to implement desired programming provided by appropriate media in at least one example. In some instances, the processing circuit 2010 may include circuitry adapted to perform a desired function, with or without implementing programming By way of example, the processing circuit 2010 may be implemented as one or more processors, one or more controllers, and/or other structure configured to execute executable programming and/or perform a desired function. Examples of the processing circuit 2010 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 2010 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 2010 are for illustration and other suitable configurations within the scope of the present disclosure are also contemplated.

The processing circuit 2010 is adapted for processing, including the execution of programming, which may be stored on the storage medium 2012. As used herein, the term "programming" shall be construed broadly to include without limitation instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

In some instances, the processing circuit 2010 may include a module for generating encoding indicator symbol 2014, a module for determining whether to encode 2016, a module for encoding 2018, a module for selecting partitioning 2020, and a module for selecting encoding type 2022. The module for generating encoding indicator symbol 2014 may include circuitry and/or programming (e.g., a module for generating encoding indicator symbol 2024 stored on the storage medium 2012) adapted to collect information about whether different groups of data bits (e.g., associated with different bus partitions) are to be encoded, generate a value based on the collected information, and generate a multi-level or comparable indication as taught herein that serves to indicate partitioning of a data bus and encoding applied to different partitions of the data bus. The module for determining whether to encode 2016 may include circuitry and/or programming (e.g., a module for determining whether to encode 2026 stored on the storage medium 2012) adapted to collect one or more groups of data bits (e.g., associated with different bus partitions), evaluate the data bits to determine whether a criterion indicative of a need to encode is met, and generate an indication of that evaluation. The module for encoding 2018 may include circuitry and/or programming (e.g., a module for encoding 2028 stored on the storage medium 2012) adapted to collect one or more groups of data bits (e.g., associated with different bus partitions), evaluate the data bits to determine a new value for at least some of the data bits according to a defined formula, replace the at least some of the data bits with the new value, and output the resulting data bits. Further, the module for selecting partitioning 2020 may include circuitry and/or programming (e.g., a module for selecting partitioning 2030 stored on the storage medium 2012) adapted to acquire one or more criteria for partition selection, identify a bus partitioning that meets the one or more criteria, and output an indication of the identified bus partitioning. Also, the module for selecting encoding type 2022 may include circuitry and/or programming (e.g., a module for selecting encoding type 2032 stored on the storage medium 2012) adapted to acquire one or more criteria for selection of a type of encoding (e.g., collect input data bits), identify a type of encoding that meets the one or more criteria, and output an indication of the identified type of encoding.

The storage medium 2012 may represent one or more processor-readable devices for storing programming, electronic data, databases, or other digital information. The storage medium 2012 may also be used for storing data that is manipulated by the processing circuit 2010 when executing programming The storage medium 2012 may be any available media that can be accessed by the processing circuit 2010, including portable or fixed storage devices, optical storage devices, and various other mediums capable of storing, containing and/or carrying programming By way of example and not limitation, the storage medium 2012 may include a processor-readable storage medium such as a magnetic storage device (e.g., hard disk, floppy disk, magnetic strip), an optical storage medium (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and/or other mediums for storing programming, as well as any combination thereof. Thus, in some implementations, the storage medium may be a non-transitory (e.g., tangible) storage medium.

The storage medium 2012 may be coupled to the processing circuit 2010 such that the processing circuit 2010 can read information from, and write information to, the storage medium 2012. That is, the storage medium 2012 can be coupled to the processing circuit 2010 so that the storage medium 2012 is at least accessible by the processing circuit 2010, including examples where the storage medium 2012 is integral to the processing circuit 2010 and/or examples where the storage medium 2012 is separate from the processing circuit 2010.

Programming stored by the storage medium 2012, when executed by the processing circuit 2010, causes the processing circuit 2010 to perform one or more of the various functions and/or process steps described herein. For example, the storage medium 2012 may include the module (e.g., operations) for generating encoding indicator symbol 2024, the module for determining whether to encode 2026, the module for encoding 2028, the module for selecting partitioning 2030, and the module for selecting encoding type 2032. Thus, according to one or more aspects of the present disclosure, the processing circuit 2010 is adapted to perform (in conjunction with the storage medium 2012) any or all of the processes, functions, steps and/or routines for any or all of the apparatuses described herein (e.g., the first electronic device 102 or the second electronic device 104). As used herein, the term "adapted" in relation to the processing circuit 2010 may refer to the processing circuit 2010 being one or more of configured, employed, implemented, and/or programmed (in conjunction with the storage medium 2012) to perform a particular process, function, step and/or routine according to various features described herein.

Figure 21:
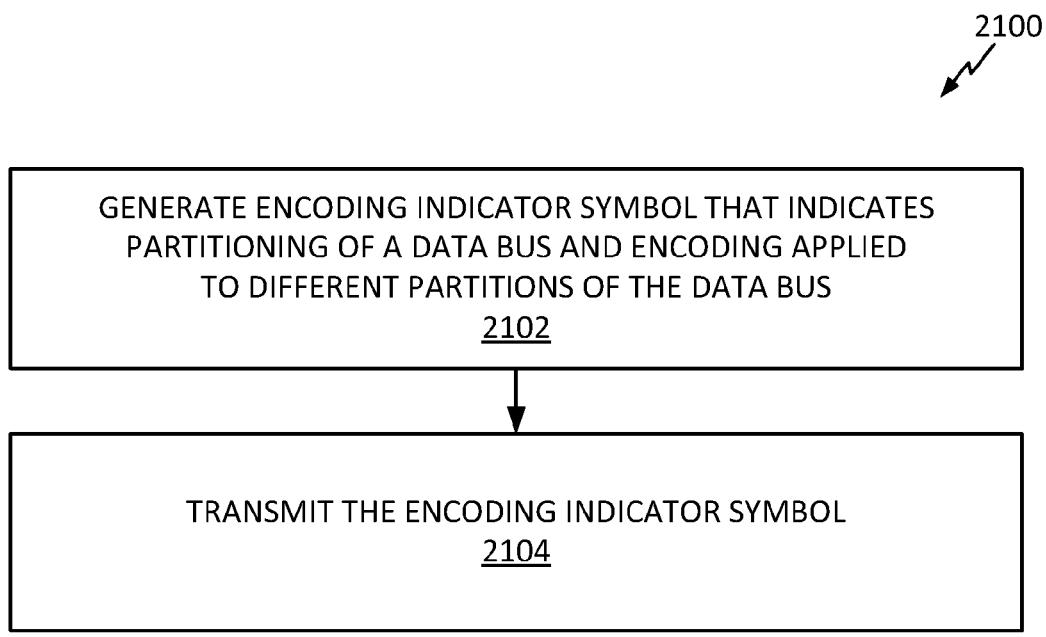
FIG. 21 is a flowchart illustrating operations that may be performed in conjunction with generating an encoding indicator symbol according to at least one example of the present disclosure.

FIG. 21 illustrates an example of operations 2100 that may be performed in conjunction with generating an encoding indicator symbol. For example, the operations 2100 of FIG. 21 could be performed by the transmitter 108 of FIG. 1, the encoder 202 of FIG. 2, the apparatus 2000 of FIG. 20, or some other suitable entity.

In block 2102, an encoding indicator symbol is generated. This symbol indicates partitioning of a data bus and encoding applied to different partitions of the data bus. In some aspects, the encoding may comprise data bus inversion. In some aspects, the data bus may be a parallel bus.

In some aspects, the encoding indicator symbol may be a multi-level signal. Here, each level of the multi-level signal may represent at least two bits of information indicative of, for each partition of the data bus, whether encoding is applied to the partition. In some aspects, the multi-level signal may be defined by at least one of: multiple voltage levels, multiple current levels, or multiple phases.

In block 2104, the encoding indicator symbol is transmitted. For example, an encoding device may transmit the encoding indicator symbol to a decoding device. In some aspects, the transmission of the encoding indicator symbol may comprise transmitting the encoding indicator symbol over a dedicated bus line.

Figure 22:
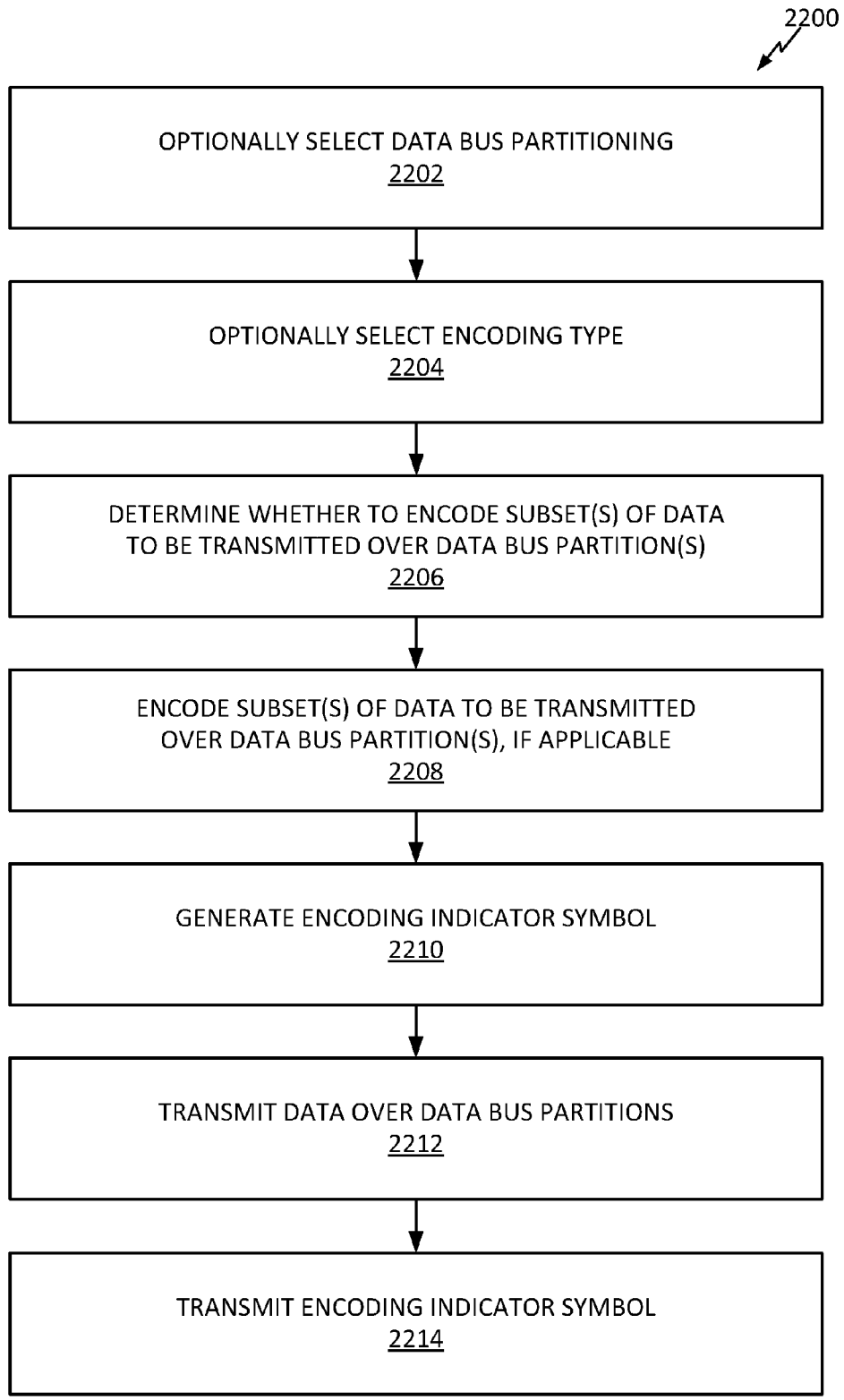
FIG. 22 is a flowchart illustrating additional operations that may be performed in conjunction with generating an encoding indicator symbol according to at least one example of the present disclosure.

FIG. 22 illustrates an example of additional operations 2200 that may be performed in conjunction with selectively encoding data and generating a corresponding encoding indicator symbol. The operations 2200 of FIG. 22 could be performed by the transmitter 108 of FIG. 1, the encoder 202 of FIG. 2, the apparatus 2000 of FIG. 20, or some other suitable entity.

In optional block 2202, the data partitioning to be employed on the data bus may be selected. These operations may correspond to, for example, the corresponding operations discussed above in conjunction with block 302 of FIG. 3. In some aspects, the operations of block 2202 may comprise selecting a partitioning of the data bus that results in lowest power consumption associated with transmission of data over the partitions or lowest interference associated with transmission of data over the partitions.

In optional block 2204, the type of encoding to be applied to data sent over the bus partitions may be selected. These operations also may correspond to, for example, the corresponding operations discussed above in conjunction with block 302 of FIG. 3. In some aspects, the operations of block 2202 may comprise selecting a type of encoding to be applied to the different partitions that results in lowest power consumption associated with transmission of data over the partitions or lowest interference associated with transmission of data over the partitions.

In block 2206, a determination is made as to whether to encode one or more subsets of data to be transmitted over one or more data bus partitions. For example, for each partition of the data bus, a determination may be made as to whether to encode a subset of data to be sent over the partition. In some aspects, the determination of whether to encode a subset of data may comprise determining whether encoding of the subset of data would reduce power consumption associated with transmission of the subset of data or reduce interference associated with transmission of the subset of data.

In block 2208, encoding is applied to any of the subsets of data identified in block 2206 as requiring encoding. Any subsets of data not identified in block 2206 as requiring encoding are not encoded.

In block 2210, an encoding indicator symbol is generated. These operations correspond in some aspects to the operations of block 2102 discussed above. In some aspects, the generation of the encoding indicator symbol may comprise selecting a value that indicates any partitions for which a corresponding subset of data is encoded.

In block 2212, the data is transmitted over the data bus partitions. In some implementations, this may involve transmitting a parallel set of data bits over the data bus during a bus cycle.

In block 2214, the encoding indicator symbol is transmitted. These operations correspond in some aspects to the operations of block 2104 discussed above. In implementations where block 2212 involves transmitting a parallel set of data bits over the data bus during a bus cycle, the operations of block 2214 may comprise transmitting the encoding indicator symbol via a single signal pin during the bus cycle.

Figure 23:
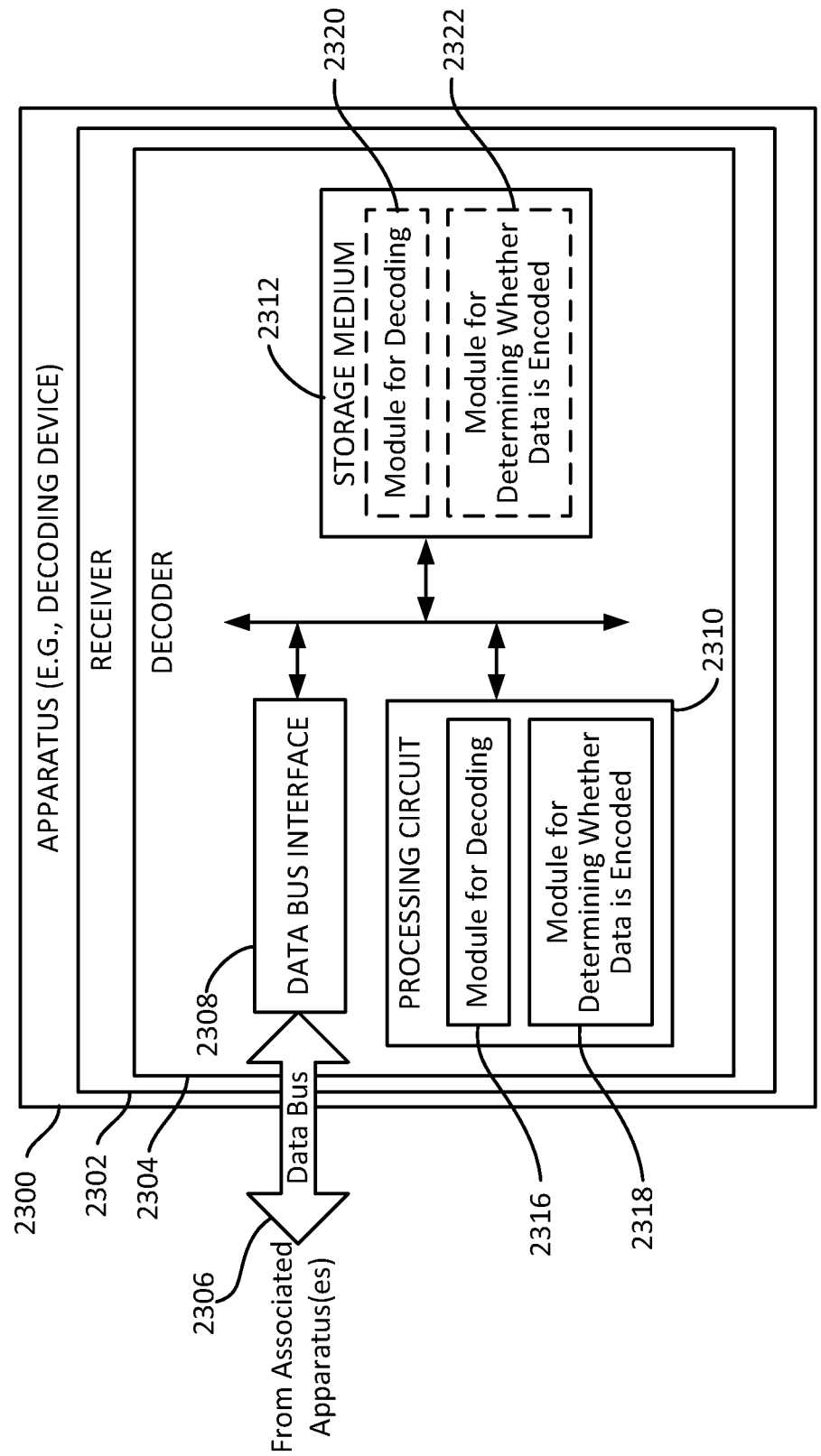
FIG. 23 is a simplified block diagram illustrating select components of an apparatus including decoding functionality according to at least one example of the present disclosure.

Turning to FIG. 23, a block diagram is shown illustrating select components of an apparatus 2300, such as the first or second electronic device 102 or 104 from FIG. 1, according to at least one example of the present disclosure. A receiver 2302 of the apparatus 2300 includes a decoder 2304 adapted to receive encoded data bits transmitted over a plurality of channels of a data bus 2306.

The decoder 2304 generally includes circuitry and/or programming adapted to decode data based on an associated encoding indicator symbol. That is, the decoder is adapted to undo the encoding performed by an encoder, such as the encoder 2004 and any of the encoding schemes described above. According to at least one example, the decoder 2304 may be coupled to a plurality of data channels of the data bus 2306 by a data bus interface 2308, and may include a processing circuit 2310 coupled to or placed in electrical communication with the data bus interface 2308 and a storage medium 2312. The data bus interface 2308 may include, for example, one or more of: signal driver circuits, signal receiver circuits, amplifiers, signal filters, signal buffers, or other circuitry used to interface with a signaling bus or other types of signaling media.

The processing circuit 2310 is arranged to obtain, process and/or send data, control data access and storage, issue commands, and control other desired operations. The processing circuit 2310 may include circuitry configured to perform a desired function and/or implement desired programming provided by appropriate media. The processing circuit 2310 may be implemented and/or configured according to any of the examples of the processing circuit 2010 described above.

The processing circuit 2310 may include a module for decoding 2316 and a module for determining whether data is encoded 2318. The module for decoding 2316 may include circuitry and/or programming (e.g., a module for decoding 2320 stored on the storage medium 2312) adapted to collect one or more groups of data bits (e.g., associated with different bus partitions), evaluate the data bits to determine a new value for at least some of the data bits according to a defined formula, replace the at least some of the data bits with the new value, and output the resulting data bits. In addition, the module for determining whether data is encoded 2318 may include circuitry and/or programming (e.g., a module for determining whether data is encoded 2322 stored on the storage medium 2312) adapted to collect an encoding indicator symbol (e.g., associated with different bus partitions), evaluate the encoding indicator symbol to determine whether one or more data bits have been encoded, and generate an indication of that evaluation.

The storage medium 2312 may represent one or more processor-readable devices for storing programming, such as processor executable code or instructions (e.g., software, firmware), electronic data, databases, or other digital information. The storage medium 2312 may be configured and/or implemented in a manner similar to the storage medium 2012 described above.

The storage medium 2312 may be coupled to the processing circuit 2310 such that the processing circuit 2310 can read information from, and write information to, the storage medium 2312. That is, the storage medium 2312 can be coupled to the processing circuit 2310 so that the storage medium 2312 is at least accessible by the processing circuit 2310, including examples where the storage medium 2312 is integral to the processing circuit 2310 and/or examples where the storage medium 2312 is separate from the processing circuit 2310.

Like the storage medium 2012, the storage medium 2312 includes programming stored thereon. The programming stored by the storage medium 2312, when executed by the processing circuit 2314, causes the processing circuit 2314 to perform one or more of the various decoding functions and/or process steps described herein. For example, the storage medium 2312 may include the module (e.g., operations) for decoding 2320 and the module for determining whether data is encoded 2322. Thus, according to one or more aspects of the present disclosure, the processing circuit 2310 is adapted to perform (in conjunction with the storage medium 2312) any or all of the decoding processes, functions, steps and/or routines for any or all of the electronic devices described herein (e.g., the electronic devices 102 or 104). As used herein, the term "adapted" in relation to the processing circuit 2310 may refer to the processing circuit 2310 being one or more of configured, employed, implemented, and/or programmed (in conjunction with the storage medium 2312) to perform a particular process, function, step and/or routine according to various features described herein.

Figure 24:
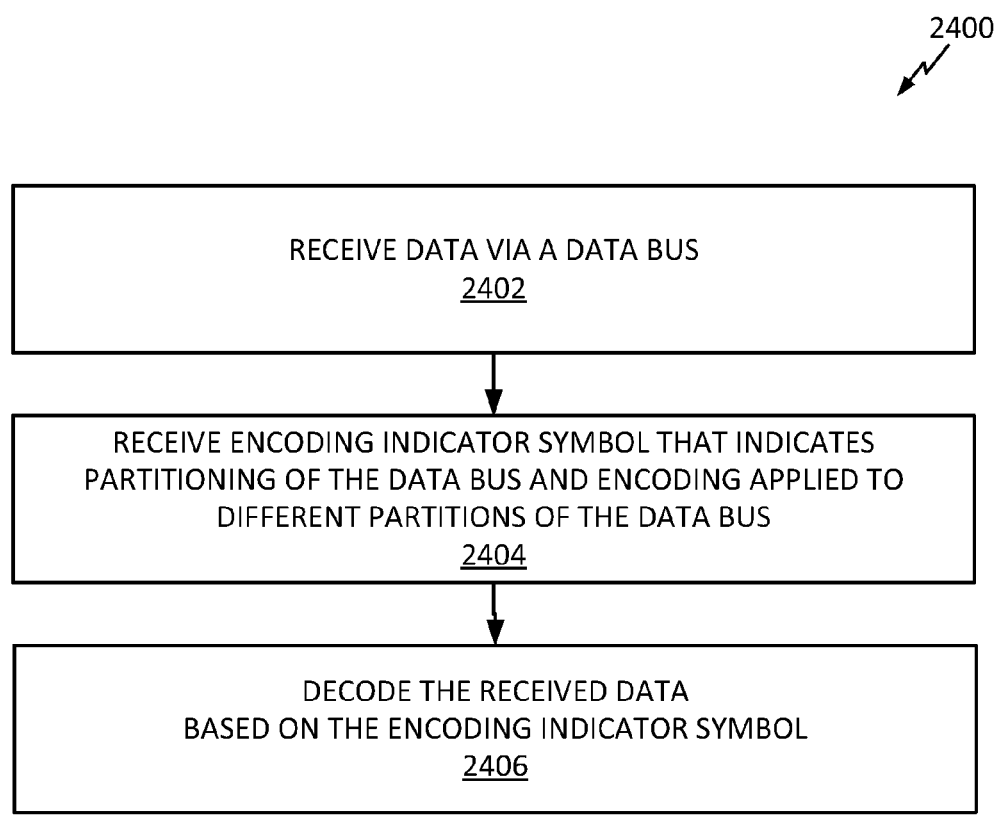
FIG. 24 is a flowchart illustrating operations that may be performed in conjunction with decoding data based on an encoding indicator symbol according to at least one example of the present disclosure.

FIG. 24 illustrates an example of operations 2400 that may be performed in conjunction with decoding data according to an associated encoding indicator symbol. Thus, these operations may correspond to an apparatus that receives the data and encoding indicator symbol transmitted in FIGS. 21 and 22. The operations 2400 of FIG. 24 could be performed by the receiver 112 of FIG. 1, the decoder 204 of FIG. 2, the apparatus 2300 of FIG. 23, or some other suitable entity.

In block 2402, data is received via a data bus. In some aspects, the data bus may be a parallel bus. In some aspects, the reception of the data may comprise receiving a parallel set of data bits over the data bus during a bus cycle.

In block 2404, an encoding indicator symbol is received. This symbol indicates partitioning of a data bus and encoding applied to different partitions of the data bus. In some aspects, the reception of the encoding indicator symbol may comprise receiving the encoding indicator symbol over a dedicated bus line. In implementations where the reception of the data at block 2402 involves receiving a parallel set of data bits over the data bus during a bus cycle, the operations of block 2404 may comprise receiving the encoding indicator symbol via a single signal pin during the bus cycle. In some aspects, the encoding may comprise data bus inversion.

In some aspects, the encoding indicator symbol may be a multi-level signal.

Here, each level of the multi-level signal may represent at least two bits of information indicative of, for each partition of the data bus, whether encoding is applied to the partition. In some aspects, the multi-level signal may be defined by at least one of: multiple voltage levels, multiple current levels, or multiple phases.

In block 2406, the data received at block 2402 is decoded based on the encoding indicator symbol received at block 2404. For example, data is decoded if the encoding indicator symbol indicates that the data is encoded.

Figure 25:
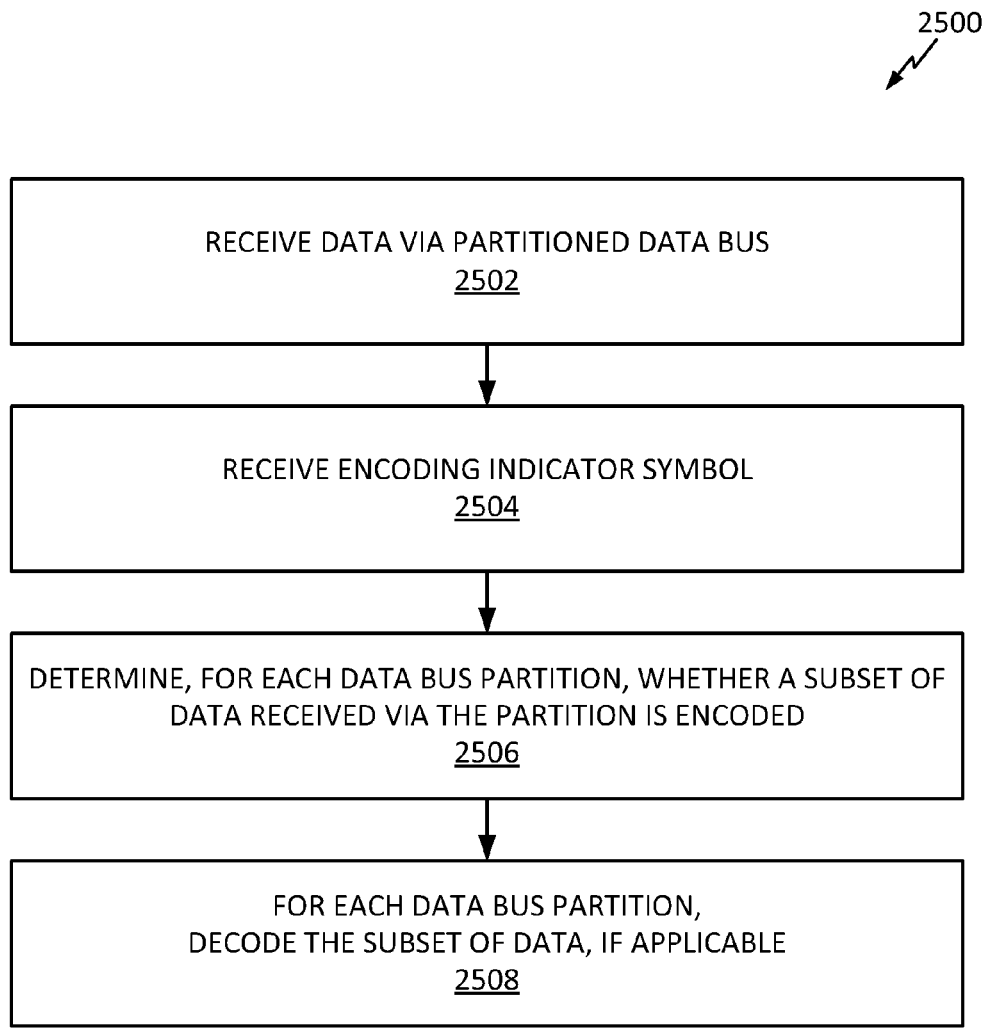
FIG. 25 is a flowchart illustrating additional operations that may be performed in conjunction with decoding data based on an encoding indicator symbol according to at least one example of the present disclosure.

FIG. 25 illustrates an example of additional operations 2500 that may be performed in conjunction with decoding data according to an associated encoding indicator symbol. Again, these operations may correspond to an apparatus that receives the data and encoding indicator symbol transmitted in FIGS. 21 and 22. The operations 2500 of FIG. 25 could be performed by the receiver 112 of FIG. 1, the decoder 204 of FIG. 2, the apparatus 2300 of FIG. 23, or some other suitable entity.

In block 2502, data is received via a partitioned data bus. These operations correspond in some aspects to the operations of block 2402 discussed above. As indicated above, the data bus may be a parallel bus.

In block 2504, an encoding indicator symbol is received. This symbol indicates partitioning of a data bus and encoding applied to different partitions of the data bus. These operations correspond in some aspects to the operations of block 2404 discussed above.

In block 2506, for each partition of the data bus, a determination is made as to whether a subset of data received via the partition is encoded. As discussed herein, this determination may be based on the encoding indicator symbol.

In block 2508, for each partition of the data bus, a subset of data is decoded depending on the corresponding determination of block 2506. For example, a subset of data is decoded if the encoding indicator symbol indicates that the subset of data is encoded.

Those of skill in the art will recognize that decoding of a group of data bits will depend on the manner in which the original group of data bits was encoded. In general, a decoding operation may perform reverse (or complementary) operations relative to the encoding operation.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein. Additional elements, components, steps, and/or functions may also be added or not utilized without departing from the present disclosure.

While features of the present disclosure may have been discussed relative to certain implementations and figures, all implementations of the present disclosure can include one or more of the advantageous features discussed herein. In other words, while one or more implementations may have been discussed as having certain advantageous features, one or more of such features may also be used in accordance with any of the various implementations discussed herein. In similar fashion, while exemplary implementations may have been discussed herein as device, system, or method implementations, it should be understood that such exemplary implementations can be implemented in various devices, systems, and methods.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function. The various methods described herein may be partially or fully implemented by programming (e.g., instructions and/or data) that may be stored in a machine-readable, computer-readable, and/or processor-readable storage medium, and executed by one or more processors, machines and/or devices.

Those of skill in the art would further appreciate that the various illustrative logical blocks, modules, circuits, and algorithm steps described in connection with the implementations disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

Accordingly, the various features associate with the examples described herein and shown in the accompanying drawings can be implemented in different examples and implementations without departing from the scope of the present disclosure. Therefore, although certain specific constructions and arrangements have been described and shown in the accompanying drawings, such implementations are merely illustrative and not restrictive of the scope of the disclosure, since various other additions and modifications to, and deletions from, the described implementations will be apparent to one of ordinary skill in the art. Thus, the scope of the disclosure is only determined by the literal language, and legal equivalents, of the claims which follow.

What is claimed is:

1. An apparatus for communication, comprising:
    a processing circuit configured to generate an encoding indicator symbol that indicates partitioning of a data bus and encoding applied to different partitions of the data bus, wherein the encoding indicator symbol is a multi-level signal, and wherein each level of the multi-level signal represents at least two bits of information indicative of, for each partition of the data bus, whether encoding is applied to the partition; and
    a bus interface coupled to the processing circuit and configured to transmit the encoding indicator symbol.

2. The apparatus of claim 1, wherein the encoding comprises data bus inversion.

3. The apparatus of claim 1, wherein the multi-level signal is defined by at least one of: multiple voltage levels, multiple current levels, or multiple phases.

4. The apparatus of claim 1, wherein:
    the data bus is a parallel bus; and
    the bus interface is configured to transmit the encoding indicator symbol over a dedicated bus line.

5. The apparatus of claim 1, wherein:
the bus interface is further configured to transmit a parallel set of data bits over the data bus during a bus cycle; and
the bus interface is configured to transmit the encoding indicator symbol via a single signal pin during the bus cycle.

6. The apparatus of claim 1, wherein:
the processing circuit is further configured to determine, for each partition of the data bus, whether to encode a subset of data to be sent over the partition; and
the processing circuit is configured to generate the encoding indicator symbol by selecting a value that indicates any partitions for which a corresponding subset of data is encoded.

7. The apparatus of claim 6, wherein the determination of whether to encode a subset of data comprises:
determining whether encoding of the subset of data would reduce power consumption associated with transmission of the subset of data or reduce interference associated with transmission of the subset of data.

8. The apparatus of claim 1, wherein the processing circuit is further configured to select a partitioning of the data bus that results in lowest power consumption associated with transmission of data over the partitions or lowest interference associated with transmission of data over the partitions.

9. The apparatus of claim 1, wherein the processing circuit is further configured to select a type of encoding to be applied to the different partitions that results in lowest power consumption associated with transmission of data over the partitions or lowest interference associated with transmission of data over the partitions.

10. A method of communication performed at a transmitting device coupled to a data bus, comprising:
generating an encoding indicator symbol that indicates partitioning of the data bus and encoding applied to different partitions of the data bus, wherein the encoding indicator symbol is a multi-level signal, and wherein each level of the multi-level signal represents at least two bits of information indicative of, for each partition of the data bus, whether encoding is applied to the partition; and
transmitting, via a bus interface circuit, the encoding indicator symbol.

11. The method of claim 10, wherein the encoding comprises data bus inversion.

12. The method of claim 10, wherein the multi-level signal is defined by at least one of: multiple voltage levels, multiple current levels, or multiple phases.

13. The method of claim 10, wherein:
the data bus is a parallel bus; and
transmitting the encoding indicator symbol comprises transmitting the encoding indicator symbol over a dedicated bus line.

14. The method of claim 10, further comprising:
transmitting a parallel set of data bits over the data bus during a bus cycle,
wherein transmitting the encoding indicator symbol comprises transmitting the encoding indicator symbol via a single signal pin during the bus cycle.

15. The method of claim 10, further comprising:
for each partition of the data bus, determining whether to encode a subset of data to be sent over the partition,
wherein generating the encoding indicator symbol comprises selecting a value that indicates any partitions for which a corresponding subset of data is encoded.

16. The method of claim 15, wherein the determination of whether to encode a subset of data comprises:
determining whether encoding of the subset of data would reduce power consumption associated with transmission of the subset of data or reduce interference associated with transmission of the subset of data.

17. The method of claim 10, further comprising selecting a partitioning of the data bus that results in lowest power consumption associated with transmission of data over the partitions or lowest interference associated with transmission of data over the partitions.

18. The method of claim 10, further comprising selecting a type of encoding to be applied to the different partitions that results in lowest power consumption associated with transmission of data over the partitions or lowest interference associated with transmission of data over the partitions.

19. An apparatus for communication, comprising:
a bus interface configured to receive data via a data bus and an encoding indicator symbol that indicates partitioning of the data bus and encoding applied to different partitions of the data bus, wherein the encoding indicator symbol is a multi-level signal, and wherein each level of the multi-level signal represents at least two bits of information indicative of, for each partition of the data bus, whether encoding is applied to the partition; and
a processing circuit coupled to the bus interface and configured to decode the received data based on the encoding indicator symbol.

20. The apparatus of claim 19, wherein the encoding comprises data bus inversion.

21. The apparatus of claim 19, wherein the multi-level signal is defined by at least one of: multiple voltage levels, multiple current levels, or multiple phases.

22. The apparatus of claim 19, wherein:
the data bus is a parallel bus; and
the bus interface is configured to receive the encoding indicator symbol from a dedicated bus line.

23. The apparatus of claim 19, wherein:
the bus interface is configured to receive a parallel set of data bits over the data bus during a bus cycle; and
the bus interface is configured to receive the encoding indicator symbol via a single signal pin during the bus cycle.

24. The apparatus of claim 19, wherein the processing circuit is further configured to, for each partition of the data bus:
determine, based on the encoding indicator symbol, whether a subset of data received via the partition is encoded; and
decode the subset of data if the encoding indicator symbol indicates that the subset of data is encoded.

25. A method of communication performed at a receiving device coupled to a data bus, comprising:
receiving data, via a bus interface circuit, from the data bus;
receiving an encoding indicator symbol that indicates partitioning of the data bus and encoding applied to different partitions of the data bus, wherein the encoding indicator symbol is a multi-level signal, and wherein each level of the multi-level signal represents at least two bits of information indicative of, for each partition of the data bus, whether encoding is applied to the partition; and
decoding the received data based on the encoding indicator symbol.

26. The method of claim 25, wherein:
the data bus is a parallel bus; and
receiving the encoding indicator symbol comprises receiving the encoding indicator symbol from a dedicated bus line.

27. The method of claim 25, further comprising, for each partition of the data bus:
   determining, based on the encoding indicator symbol, whether a subset of data received via the partition is encoded; and
   decoding the subset of data if the encoding indicator symbol indicates that the subset of data is encoded.

* * * * *